(12) United States Patent
Taniyama et al.

(10) Patent No.: US 6,520,733 B1
(45) Date of Patent: Feb. 18, 2003

(54) SUBSTRATE TRANSPORT AND APPARATUS

(75) Inventors: Hiroki Taniyama, Tosu (JP); Hiroyuki Ataka, Kurume (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/710,889

(22) Filed: Nov. 14, 2000

Related U.S. Application Data

(62) Division of application No. 09/266,576, filed on Mar. 11, 1999.

(30) Foreign Application Priority Data

| Mar. 12, 1998 | (JP) | 10-082684 |
| Mar. 13, 1998 | (JP) | 10-082523 |

(51) Int. Cl.[7] .................................. B25J 18/00
(52) U.S. Cl. .......................... 414/749.5; 414/744.3
(58) Field of Search .................... 414/749.5, 744.3, 414/664, 668; 52/115, 118; 212/348; 74/110; 187/215, 229, 234, 270

(56) References Cited

U.S. PATENT DOCUMENTS

| 2,670,811 A | * | 3/1954 | Shatter | 187/229 |
| 3,760,956 A | * | 9/1973 | Burch | 414/744.3 |
| 3,970,171 A | * | 7/1976 | Honecker et al. | 187/234 |
| 4,026,432 A | * | 5/1977 | Abels | 187/234 X |
| 4,337,868 A | * | 7/1982 | Gattu | 212/348 |
| 5,125,789 A | * | 6/1992 | Farr | 414/728 |
| 5,700,127 A | | 12/1997 | Harada et al. | |
| 5,803,932 A | | 9/1998 | Akimoto et al. | |
| 5,915,396 A | | 6/1999 | Kinose | |
| 5,967,159 A | | 10/1999 | Tateyama | |
| 6,009,890 A | | 1/2000 | Kaneko et al. | |
| 6,146,083 A | * | 11/2000 | Iwasaki | 414/744.3 |

FOREIGN PATENT DOCUMENTS

| DE | 3745134 C2 | 11/1987 |
| DE | 3909669 A1 | 10/1989 |
| DE | 4210110 A1 | 11/1992 |

* cited by examiner

*Primary Examiner*—Donald W. Underwood
(74) *Attorney, Agent, or Firm*—Oblon, Spivak, McClelland, Maier & Neustadt, P.C.

(57) ABSTRACT

A substrate transporting method including inputting process data and determining whether a number of units required for processing a wafer is an odd number or an even number. Depending on the number of units required for processing the wafer, steps of transporting the wafer, taking out the wafer from a cassette section, loading the wafer, unloading the wafer and loading the wafer into a cassette section are performed via predetermined arms and with predetermined processing units.

6 Claims, 17 Drawing Sheets

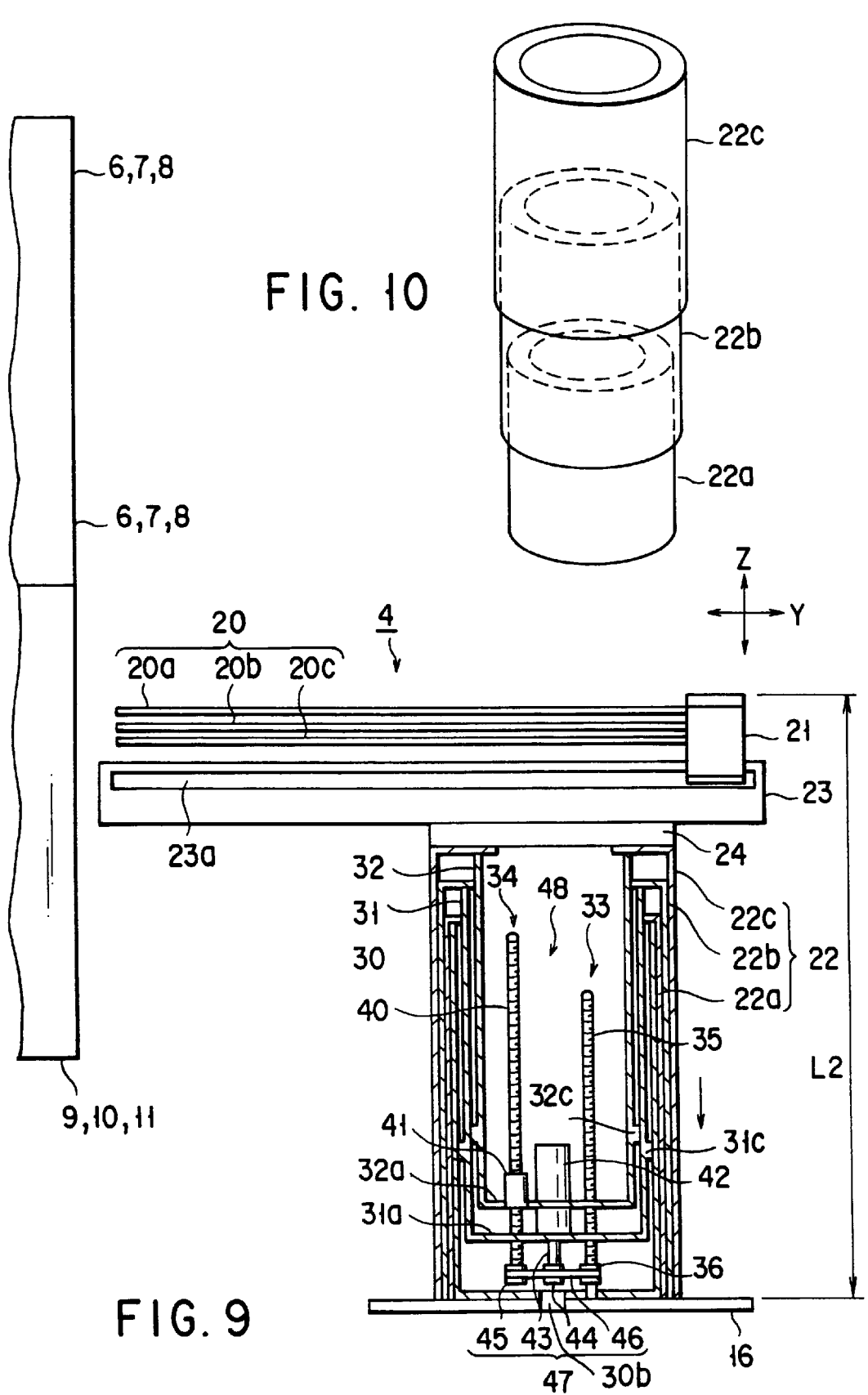

SUBSTRATE TRANSPORT AND APPARATUS

This is a Division of Application Ser. No. 09/266,576, filed Mar. 11, 1999.

BACKGROUND OF THE INVENTION

The present invention relates to a substrate transport method and apparatus for transporting a substrate to a processing section to clean the surface of the substrate, and also relates to a substrate processing system having the substrate transport apparatus.

In a photolithographic process of manufacturing the semiconductor devices, it is very important to maintain the surface of the wafer clean. This is because if contaminants, such as particles, organic substances, and metallic ions, are attached to the surface of the semiconductor wafer, they significantly defect a circuit pattern of the semiconductor device. Therefore, in the photolithographic process, the wafer surface is usually washed when necessary. The contaminants are removed from the wafer surface, for example, by rubbing the wafer surface by a brush while a chemical washing solution is poured thereon. Such a washing treatment is usually carried out in a washing apparatus equipped with a spin chuck and a rotatory brush.

As shown in FIG. 1, a conventionally used substrate processing system 100 has a processing section 104 for washing the surface of the wafer with a chemical solution and drying it, and a substrate transporting arm mechanism 105 for transporting the wafer W to the processing section 104. The processing section 104 has three processing units 101, 102, 103. The substrate transport apparatus 105 has three arms 106a, 106b, 106c. The processing units 101, 102, 103 have loading/unloading ports 101a, 102a, 103a, respectively. The wafer W is loaded/unloaded into/from units 101, 102, 103 through the loading/unloading ports 101a, 102a, 103a, respectively.

The substrate transport apparatus. 105 has an X-axis driving mechanism for moving an arm portion 106 in an X-axis direction, a Z-axis driving mechanism 107 for moving the arm portion 106 in a Z-axis direction, a θ-axis driving mechanism for rotating the arm portion 106 around the Z-axis, and a back-and-forth moving mechanism for moving each of arms 106a, 106b, 106c back and forth. The Z-axis driving mechanism 107 has a single ball screw 110 whose rotation movement is driven by a motor 109. The motor 109 and the ball screw 110 are surrounded by a cover 108 in the expandable bellows form.

However, when the Z-axis driving mechanism 107 is used for a long time, particles are sometimes generated from the cover 108 in the form of bellows, attaching onto the wafer W.

Furthermore, as shown in FIG. 2, the vertical opening length of the loading/unloading port 101a in the conventional apparatus is larger than the vertical size of an assembly of three arms 106a, 106b, 106c. Thus, the particles are likely to enter the processing unit 101 when the wafer W is loaded/unloaded. In addition, a shutter 130 is moved in a long distance and thus long time is required to open/shut the loading/unloading port 101a. As a result, throughput of the treatment decreases. Furthermore, it take long time to exchange the first arm 106a arranged at the uppermost stage and the third arm 106c arranged at the lowermost stage, with the result that the throughput decreases.

BRIEF SUMMARY OF THE INVENTION.

An object of the present invention is to provide a substrate transporting method and apparatus, and a substrate processing system capable of reducing time required, for loading and unloading a substrate into/from a processing unit, thereby improving the throughput.

Another object of the present invention is to provide a substrate transport apparatus having a driving mechanism which does not allow the particles to leak outside.

According to the present invention, there is provided a method of transporting a substrate by using a substrate transport apparatus which comprises:

first, second, and third arms arranged vertically in multiple stages, a plurality of processing units each having a load/unload port for loading/unloading the substrate, the method comprising:
(a) inputting data of processing conditions for processing the substrate;
(b) determining whether a number of processing units required for processing the substrate is an odd number or an even number;
(c1) when a determination result of the step (b) is an odd number,
transporting the substrate, in accordance with the following steps (d1) to (i1):
(d1) taking out the substrate by the second arm from a substrate loading/unloading section;
(e1) loading the substrate by the second arm to an odd-numbered processing unit;
(f1) unloading the substrate by the third arm from an odd-numbered processing unit; except for a final processing unit;
(g1) loading the substrate by the third arm to an even-numbered processing unit;
(h1) unloading the substrate by the second arm from an even-numbered processing unit; and
(i1) unloading the substrate from the final processing unit by the first arm and loading the substrate by the first arm into the substrate loading/unloading section; and
(c2) when a determination result of the step (b) is an even number,
transporting the substrate, in accordance with the following steps (d2) to (i2);
(d2) taking out the substrate by the third arm from the substrate loading/unloading section;
(e2) loading the substrate by the third arm into an odd-numbered processing unit;
(f2) unloading the substrate by the second arm from an odd-numbered processing unit;
(g2) loading the substrate by the second arm into an even-numbered processing unit;
(h2) unloading the substrate by the third arm from an even-numbered processing unit except for a final processing unit; and
(i2) unloading the substrate by the first arm from the final processing unit and loading the substrate by the first arm into the substrate loading/unloading section.

Note that a second substrate to be used next may be taken out from the substrate loading/unloading section in advance by the second arm during a period from the step (e1) to (f1).

Furthermore, the second substrate may be unloaded from an odd-numbered processing unit in advance by the third arm during a period from the step (g1) to (h1).

Moreover, the second substrate may be taken out from the substrate loading/unloading section in advance by the third arm during a period from the step (e2) to (f2).

Still further, the second substrate may be unloaded from an odd-numbered processing unit in advance during a period from the step (g2) to (h2).

According to the present invention, there is provided a substrate processing system comprising:

a substrate loading/unloading section for receiving a plurality of substrates and sending out the substrates sequentially one by one;

a processing section having a plurality of processing units each having a loading/unloading port for loading and unloading the substrates;

a substrate transport apparatus which has first, second, and third arms arranged movable between the substrate loading/unloading section and the processing section and set vertically in multiple stages, and which has an arm back-and-forth moving mechanism for moving each of the first, second, and third arms, back and forth;

a control section for controlling an operation of the substrate transport apparatus; and data input means for inputting data of processing conditions for processing the substrate into the control section.

The control section controls the substrate transport apparatus by determining whether a number of processing units required for processing the substrate is an odd number or an even number on the basis of the data of processing conditions;

when a determination result is an odd number, taking out the substrate, by the second arm, from the substrate loading/unloading section;

loading the substrate by the second arm to an odd-numbered processing unit, unloading the substrate by the third arm from an odd-numbered processing unit except for a final processing unit;

loading the substrate by the third arm to an even-numbered processing unit;

unloading the substrate by the second arm from an even-numbered processing unit;

unloading the substrate by the first arm from the final processing unit; and further loading the substrate by the first arm into the substrate loading/unloading section; and when the determination result is an even number, taking out the substrate, by the third arm, from the substrate loading/unloading section;

loading the substrate by the third arm to an odd-numbered processing unit;

unloading the substrate by the second arm from an odd-numbered processing unit;

loading the substrate by the second arm from an even-numbered processing unit;

unloading the substrate by the third arm from an even-numbered processing unit except for a final processing unit;

unloading the substrate by the first arm from the final processing unit; and further loading the substrate by the first arm into the substrate loading/unloading section.

The substrate transport apparatus comprises:

a θ rotation driving mechanism for rotating by an angle of θ around each of vertical axes of the first, second, and third arms;

an arm back-and-forth moving mechanism for moving each of the first, second, and third arms, back and forth;

a Z-axis driving mechanism for moving the first, second, and third arms in the Z-axis direction; and a cover assembly consisting of a plurality of slide covers surrounding the Z-axis driving mechanism and slidably assembled with each other, a diameter of an upper slide cover being larger than a diameter of a lower slide.

In this case, it is preferable that the cover assembly be formed by concentrically assembling a plurality of cylindrical slide covers.

Further in this case, it is preferable that the loading/unloading port of the processing unit be sufficiently large to load and unload two arms of the first, second, third arms.

According to the present invention, there is provided a substrate transport apparatus for transporting substrates from a substrate loading/unloading section to a processing section sequentially one by one, comprising:

a plurality of arms for holding a substrate;

a θ rotation driving mechanism for rotating the plurality of arms simultaneously around a vertical axis by an angle of θ;

an arm back-and-forth moving mechanism for moving each of the plurality of arms, back and forth;

a Z-axis driving mechanism for moving the plurality of arms, simultaneously up and down; and a cover assembly surrounding the Z-axis driving mechanism in order to shut out the Z-axis driving mechanism from an outer atmosphere, the cover assembly consisting of a plurality of cylindrical slide covers slidably assembled concentrically, in which, when the plurality of arms are moved up by the Z-axis driving mechanism, an outer slide cover slidably moves to an inner slide cover, with the result that the outer slide cover is located above the inner slide cover.

The cover assembly comprises:

an unmovable slide cover member which is not driven by up-and-down movement of the Z-axis driving mechanism and thus maintained unmoved;

a first movable slide cover slidably driven by the up-and-down movement of the Z-axis driving mechanism, relative to the unmovable slide cover; and a second movable slide cover slidably driven by the up-and down movement of the Z-axis driving mechanism, relative to the first movable slide cover.

It is preferable that the Z-axis driving mechanism comprise:

a first ball screw mechanism for moving the first movable slide cover up and down to the unmovable slide cover; and a second ball screw mechanism for moving the second movable slide cover up and down to the first movable slide cover.

In this case, it is preferable that the first ball screw mechanism comprise:

an unmovable support member connected to the unmovable slide cover;

a first ball screw fixed to the unmovable support member;

a first nut engaged with the first ball screw;

a belt hanging around the first nut; and a common motor for transmitting rotatory driving force to the belt; and the second ball screw mechanism comprises:

a first movable support member connected to the first movable support member;

a second movable support member connected to the second movable slide cover;

a second nut engaged with the second ball screw and fixed to the second movable support member; and a pulley having the belt hung thereon and fitted to a lower portion of the second ball screw.

Furthermore, the Z-axis driving mechanism may comprise:

a first rack/pinion mechanism for moving the first movable slide cover up and down to the unmovable slide cover; and a second rack/pinion mechanism for moving the second movable slide cover up and down to the first movable slide cover.

In this case, it is preferable that the first rack/pinion mechanism comprise:

a first rack fixed on the unmovable slide cover;

a common pinion engaged with the first rack; and a common motor for transmitting rotatory driving force to the common pinion, and the second rack/pinion mechanism comprises:

a second movable support member connected to the second movable slide cover; and a second rack fitted to the second movable support member and engaged with the common pinion.

According to the present invention, it is possible to reduce time for loading/unloading the substrate into/from the processing unit. The opening area of the loading/unloading port is reduced. It is therefore possible to prevent an inner atmosphere of the process unit containing chemical substances from being dispersed into an outer atmosphere and to suppress particles from being introduced into the inside the process unit to minimum.

Regardless the number of the processing units, namely, odd number or even number, the arm portion may be moved only by the distance corresponding to two steps in the final processing unit. Therefore, the throughput is increased and the durability of the substrate transport apparatus is improved. As a result, energy saving of the substrate processing system is successfully attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a cross sectional view of the substrate transport apparatus according to an embodiment of the present invention accompanying a block diagram of peripheral elements;

FIG. 10 is a perspective view of a multiple-step cover concentrically arranged, for covering a liftable mechanism;

DETAILED DESCRIPTION OF THE INVENTION

Now, various preferred embodiments of the present invention will be explained with reference to the accompanying drawings.

Figure 3:
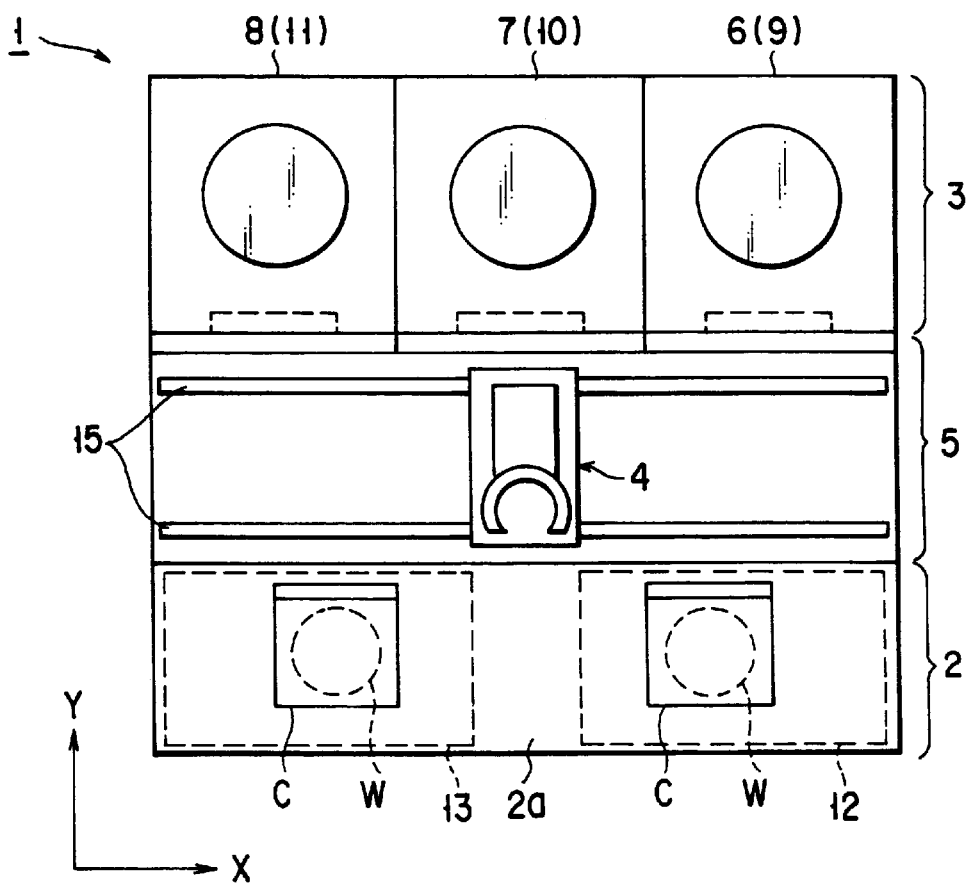
FIG. 3 is a schematic plan view of a substrate processing system for washing a semiconductor wafer.
Figure 4:
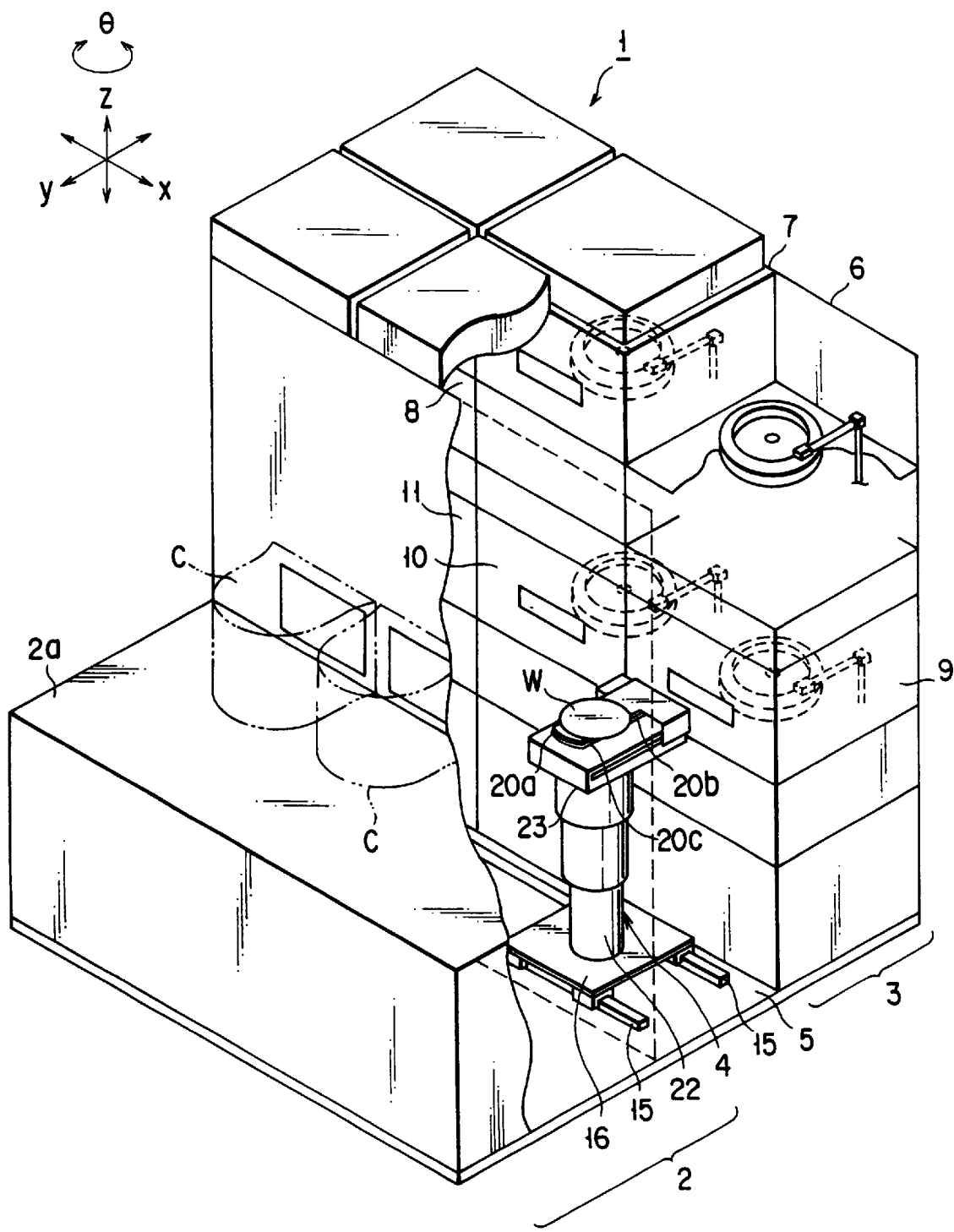
FIG. 4 is a perspective view of the substrate processing system for washing a semiconductor wafer.

As shown in FIGS. 3 and 4, a substrate processing system 1 has a loader/unloader section 2, a process section 3 and a transfer section 5. The loader/unloader section 2 serving as a substrate loading/unloading section has a table 2a extending in the X-axis direction. In a front surface side of the table 2a, a cassette transport passage (not shown) is arranged. A cassette C is transported along the transport passage by a transport robot (not shown) and set on the table 2a. For example, two or three cassettes C are mounted on the table 2a. 25 sheets of semiconductor wafers W constituting one lot, are stored in each cassette.

First, second, and third processing units 6, 7, 8 are arranged side by side in the order mentioned in the processing section 3. Fourth, fifth, and sixth units 9, 10, 11 are arranged below the first, second, third units 6, 7, 8, correspondingly. Since the units 9–11 are substantially the same as the units 6–8, detailed explanation will be omitted.

The cassette 2a of the loader/unloader section 2 is divided into a loading region 12 and an unloading region 13. Unwashed wafers W are stored in a cassette C placed in the loading region 12. Washed wafers W are stored in a cassette C placed in the unloading region 13. When the cassette C is filled with the washed wafers W, the cassette C is loaded out of the washing system 1 by the transport robot (not shown).

Figure 8:
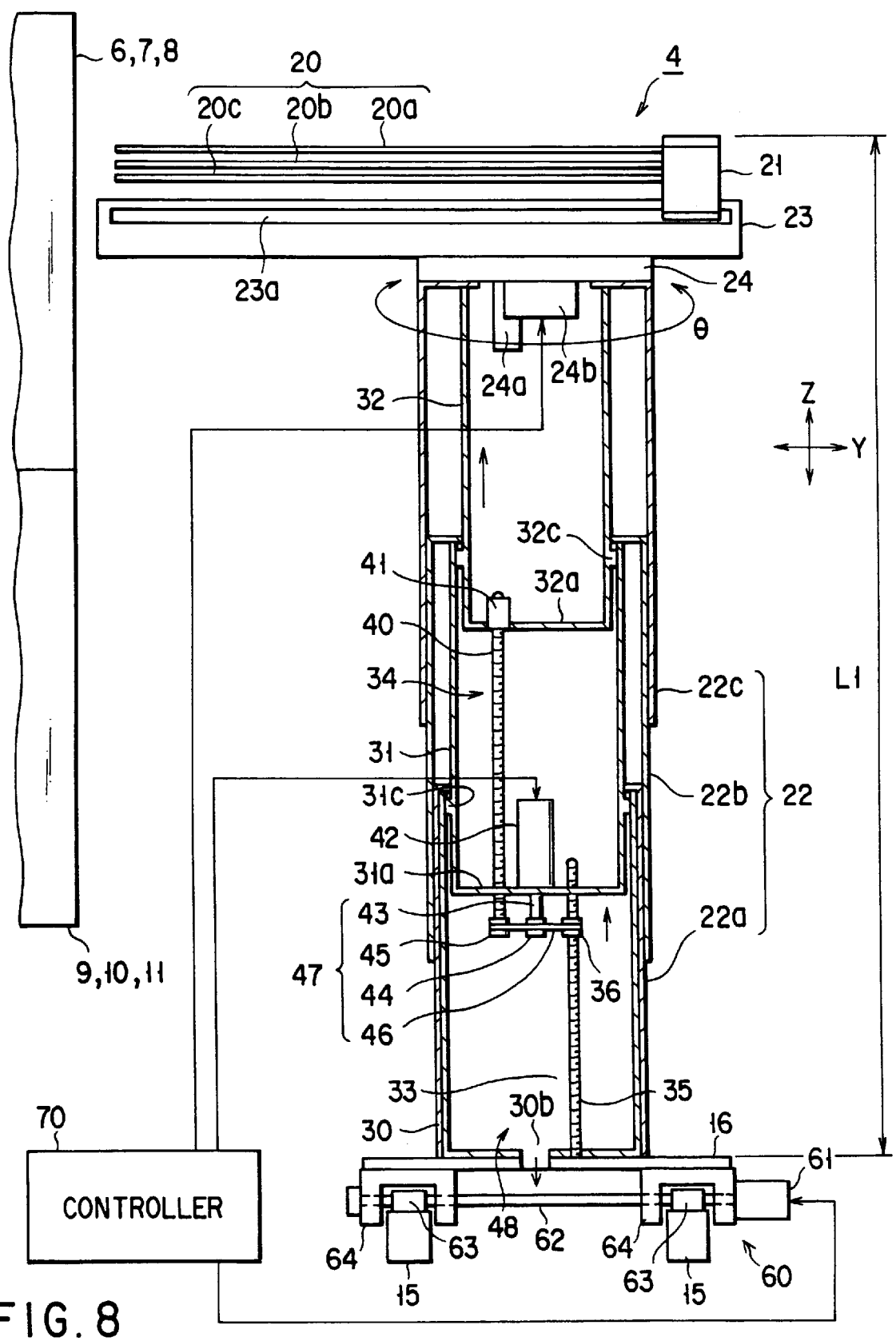
FIG. 8 is a cross sectional view of a substrate transport apparatus according to an embodiment of the present invention accompanying a block diagram of peripheral elements.

The transport section 5 is provided at a rear surface side of the table 2a. The transport section 5 houses a substrate transport apparatus 4 therein. As shown in FIG. 8, the substrate transport apparatus 4 has an arm portion 20, an arm back-and-forth moving mechanism 21, a cover assembly 22, a base table 23, a θ rotation driving mechanism 24, a Z-axis driving mechanism 47, an X-axis driving mechanism 60, and a controller 70. The arm portion 20 has a first arm 20a, a second arm 20b, and a third arm 20c in the order mentioned from the above.

The controller 70 controls each operation of driving mechanisms 21, 24, 47, 60 on the basis of data initially input thereto. A pair of rails 15 extending in the X-direction is laid on the floor of the transport section 5. The substrate transport apparatus 4 is moved along the pair of rails 15 in the X-axis direction by the X-axis driving mechanism 60 shown in FIG. 8.

A loading/buffer mechanism (not shown) is arranged at one of the sides of the transfer section 5 and an unloading/buffer mechanism (not shown) at the other side thereof. The unwashed wafer W is taken out from the cassette C by means of the second arm 20b and/or third arm 20c of the substrate transfer apparatus 4 and temporarily stored in the loading/buffer mechanism. Furthermore, the washed wafer W is taken out from the unloading/buffer mechanism by the first arm 20a of the substrate transfer apparatus 4 and stored in the cassette C.

Figure 5:
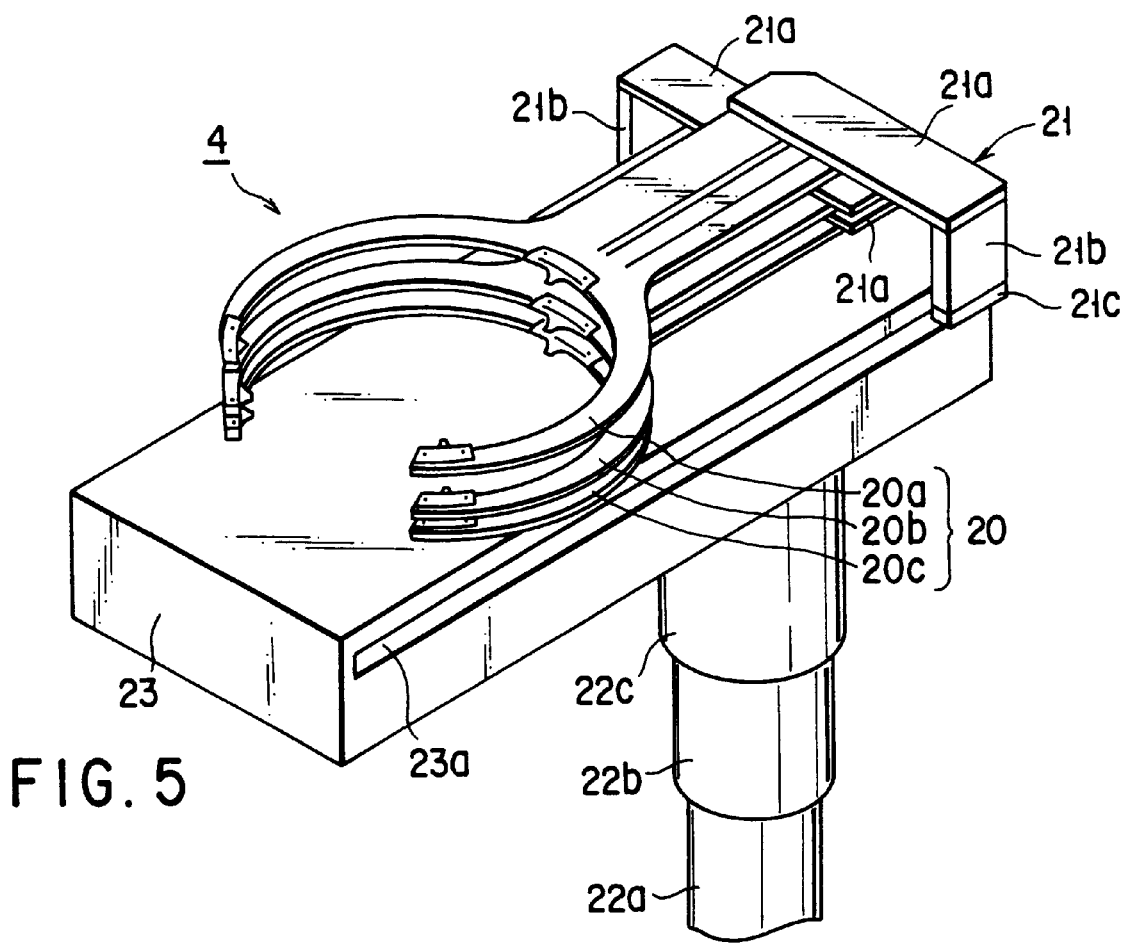
FIG. 5 is a perspective view of a substrate transport apparatus according to an embodiment of the present invention.

As shown in FIG. 5, the arm portion 20 has three arms 20a, 20b, 20c for holding the wafer W. Each of the arms 20a, 20b, 20c is supported by the arm back-and-forth moving mechanism 21 so as to move back and forth individually.

Figure 6:
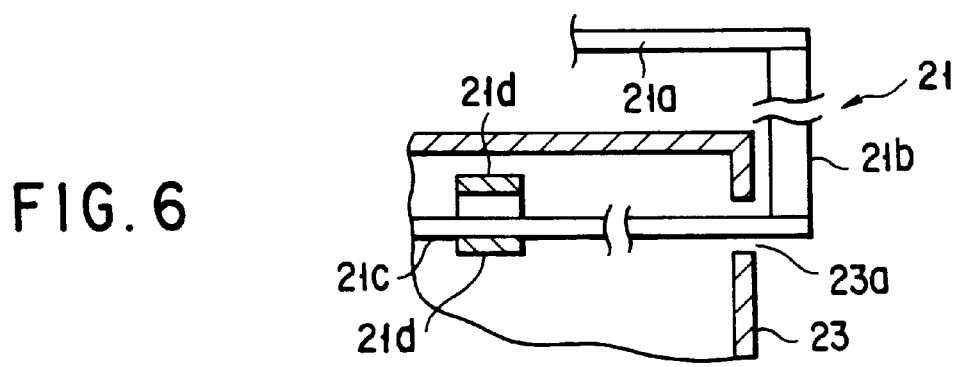
FIG. 6 is a cross sectional view of an arm back-and-forth moving mechanism as viewed from a back-and-forth moving direction.
Figure 7:
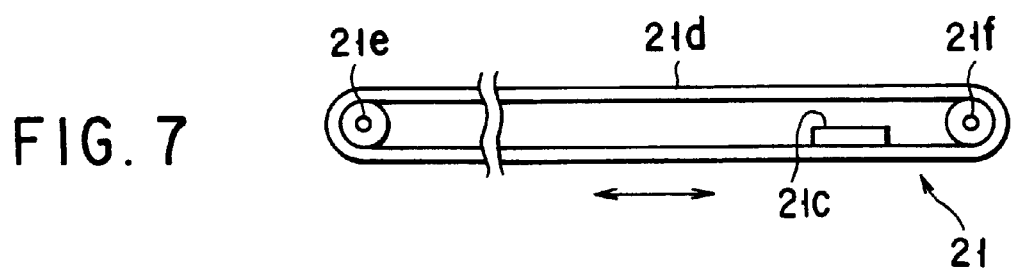
FIG. 7 is a view showing a gist portion of the arm back-and-forth moving mechanism.

As shown in FIGS. 6 and 7, the arm back-and-forth moving mechanism 21 has support members 21a, 21b, 21c, an endless timing belt 21d, a pair of pulleys 21e, 21f, and a stepping motor (not shown). One end of the first support member 21a is horizontally connected to a proximal end of the arm 20a (20b, 20c). The upper end of the support member 21b is vertically connected to the other end of the first support member 21a. One end of the third support member 21c is horizontally connected to the lower end of the second support member 21b. Furthermore, the other end of the third support member 21c is inserted into the base table 23 through an opening 23a and connected to an endless belt 21d. The endless belt 21d is stretched between the driving pulley 21e and the follower pulley 21f. The driving pulley 21e is connected to a rotatory driving axis (not shown) of the stepping motor.

The first arm 20a, second arm 20b, and third arm 20c of the substrate transport apparatus 4 are selectively used to maintain cleanliness of the wafer W which has been applied to a series of treatments in the first, second, and third processing units 6, 7, 8. To describe more specifically, the wafer W is taken out from the cassette C of the loading region 12, loaded into the first processing unit 6 and unloaded therefrom, loaded into the second processing unit 7 and unloaded therefrom, and loaded into the third processing unit 8 by the second arm 20b and the third arm 20c. On the other hand, the wafer W is unloaded from the third processing unit 8 and stored in the cassette C of the unloading region 13 only by the first arm 20a. This is because there is the smallest possibility for the particles to fall on the wafer W held by the first arm 20a.

In the meantime, the procedure for transporting the wafer varies depending upon whether the wafer W is processed in either an odd number or an even number of processing units. When the washing is carried out in an odd-numbered processing units, the controller 70 controls the substrate transport apparatus 4 so as to first take out the wafer W from the cassette C of the loading region 12 by the second arm 20b. In this case, the wafer W is loaded by the second arm 20b into odd-numbered (first, third) processing units 6, 8. The wafer W is then unloaded by the third arm 20c from an odd-numbered first processing unit 6 except for the final processing unit 8. The wafer W is loaded into and unloaded from an even-numbered (second) processing unit 7, by the third arm 20c.

On the other hand, when the number of washing units is an even number, the controller 70 controls the substrate transfer apparatus 4 so as to first take out the wafer W from the cassette C of the loading region 12 by the third arm 20c. In this case, the wafer W is loaded by the third arm 20c into an odd-numbered (first) the processing unit 7 (or 6). The wafer W is unloaded from the processing unit 7 (or 6) by the second arm 20b and loaded into an even-numbered (second) processing unit 8.

As shown in FIG. 8, the θ rotation driving mechanism 24 is fitted right below the arm portion 20 with the base table 23 interposed between them. The θ rotatory driving mechanism 24 has a rotation shaft 24a connected to the base table 23 and a stepping motor 24b for rotating the rotation shaft 24a. The arm portion 20 is rotated by an angle of θ around the Z-axis by the mechanism 24.

The X-axis moving mechanism 60 has a motor 61, a shaft 62, wheels 63 and brackets 64. The shaft 62 is connected to a rotatory driving shaft of the motor 61 and rotatably supported by the brackets 64 via bearings. Note that the brackets 64 are fitted to the lower surface of the base plate 16. The wheels 63 are fitted to the shaft 62 and movably provided on the rails 15.

Next, the Z-axis driving mechanism 47 will be explained with reference to FIGS. 8 to 10.

The Z-axis driving mechanism 47 has a cover assembly 22 consisting of first, second, third slide covers 22a, 22b, 22c, an unmovable support member 30, first and second movable support members 31, 32 and the first and second ball screw mechanisms 33, 34. The unmovable support member 30 is fixed on the base plate 16 together with the first slide cover 22a. The unmovable support member 30 is formed cylindrically and houses a first ball screw mechanism 33 and a part of a second ball screw mechanism 34 therein. Incidentally, the unmovable support member 30 is covered with the first slide cover 22a in contact with the outer periphery. At the bottom of the unmovable support member 30, an exhaust port 30b is formed which communicates with a factory exhaust passage assembly (not shown). An inner space 48 of the cover assembly 22 is evacuated through the exhaust port 30b.

The first movable support member 31 is a hollow cylinder closed with a bottom portion 31a and houses a part of the first ball screw mechanism 33 and a second ball screw mechanism 34 therein. A slide seal 31c is provided in the lower outer periphery of the first movable support member 31. The first movable support member 31 and the unmovable support member 30 are slidably fit to each other with the slide seal 31c interposed between them. The upper end portion of the first movable support member 31 is connected to the second slide cover 22b. The second slide cover 22b is moved up and down together with the first movable support member 31 by the first ball screw mechanism 33. Note that the first movable support member 31 is covered with a second slide cover 22b in contact with the outer periphery thereof.

The second movable support member 32 is a hollow cylinder closed with a bottom portion 32a and houses a part of the second ball screw mechanism 34 and a part of the θ rotation driving mechanism 24. A slide seal 32c is provided in the lower outer periphery of the second movable support member 32. The first and second movable support members 31 and 32 are slidably fitted to each other with the slide seal 32c interposed between them. Furthermore, the upper end portion of the second movable support member 32 is connected to the third slide cover 22c and moved up and down together with the second movable support member 32 by the second ball screw mechanism 34. Note that the second movable support member 32 is covered with the third slide cover 22c in contact with the outer periphery thereof. Note that the upper end portion of the third slide cover 22c is connected to the lower portion of the frame of the θ rotation driving mechanism 24.

As shown in FIG. 10, the first, second, third slide covers 22a, 22b, 22c constituting the cover assembly 22 are hollow cylinders concentrically arranged. These slide covers are formed of stainless steel having a fluorine resin coated thereon. The first slide cover 22a is arranged within the second slide cover 22b. The second slide cover 22b is arranged within the third slide cover 22c. In other words, the outer diameter of the first slide cover 22a is smaller than the inner diameter of the second slide cover 22b. The outer diameter of the second slide cover 22b is smaller than the inner diameter of the third slide cover 22c. On the other hand, the unmovable support member 30 is arranged outside the first movable support member 31. The first movable support member 31 is arranged outside the second movable support member 32. In other words, the inner diameter of the unmovable support member 30 is larger than the outer diameter of the first movable support member 31. The inner diameter of the first movable support member 31 is larger than the outer diameter of the second movable support member 32. For example, when the wafer W of 12 inch diameter is used, the unmovable support member 30 has an inner diameter of 280 mm and a length of 400–500 mm. The first movable support member 31 has an inner diameter of 260 mm and a length of 400–500 mm. The second movable support member 32 has an inner diameter of 240 mm and a length of 400–500 mm.

Furthermore, the first and second ball screw mechanisms 33, 34 will be explained more specifically with reference to FIGS. 8 and 9.

The first and second ball screw mechanisms 33, 34 have screws 35, 40 and nuts 36, 45, respectively and a common motor 42. The common motor 42 is fixed at the bottom portion 31a of the first movable support member 31. Its rotation shaft 43 protrudes downward from the bottom portion 31a. The first screw 35 is engaged with a first nut 36. The second screw 40 is equipped with a follower pulley 45. The rotation shaft 43 of the common motor 42 is equipped with the driving pulley 44. A belt 46 is stretched between the nut 36 and the pulleys 44, 45. When the common motor 42 is driven, the rotatory driving force is transmitted to the nut 36 and the pulley 45, individually. It follows that the nut 36 is moved up and down relatively to the screw 35. Synchronously with this, the pulley 45 is moved up and down together with the screw 40.

The first screw 35 is fixed on the base plate 16 and the first slide cover 22a at the lower end. The upper portion thereof passes through the bottom portion 31a and reaches within the first movable support member 31. The second screw 40 is connected to the follower pulley 45 at the lower end. The upper portion passes through the bottom portion 32a and reaches within the second movable support member 32. The upper portion of the second screw 40 is fitted to a second nut 41 within the second movable support member 32. Note that the first screw 35 passes through guide holes formed in the bottom portions 31a, 32a. Bearing (not shown) are provided at the bottom portions 31a, 32a through which the second screw 40 passes.

FIG. 8 shows a substrate transport apparatus 4 whose a cover assembly 22 is most extended.

In the state shown in FIG. 8, when the wafer W of 12 inch diameter is used, the height L1 from the base plate 16 to the arm portion 20 ranges from about 1000 to 1300 mm. In this case, the third slide cover 22c which is positioned at the outermost side, is located at the uppermost position. FIG. 9 shows the substrate transport apparatus 4 whose cover assembly 22 is most shrunk. In the state shown in FIG. 9, when the wafer W of 12 inch diameter, the height L2 from the base plate 16 to the arm portion 20 ranges from about 300 to 500 mm. In this case, the Z-axis driving mechanism 47 is sufficiently protected by multiple slide covers, namely, first, second, and third slide covers 22a, 22b, 22c, with the result that leakage of particles never occurs.

Figure 1:
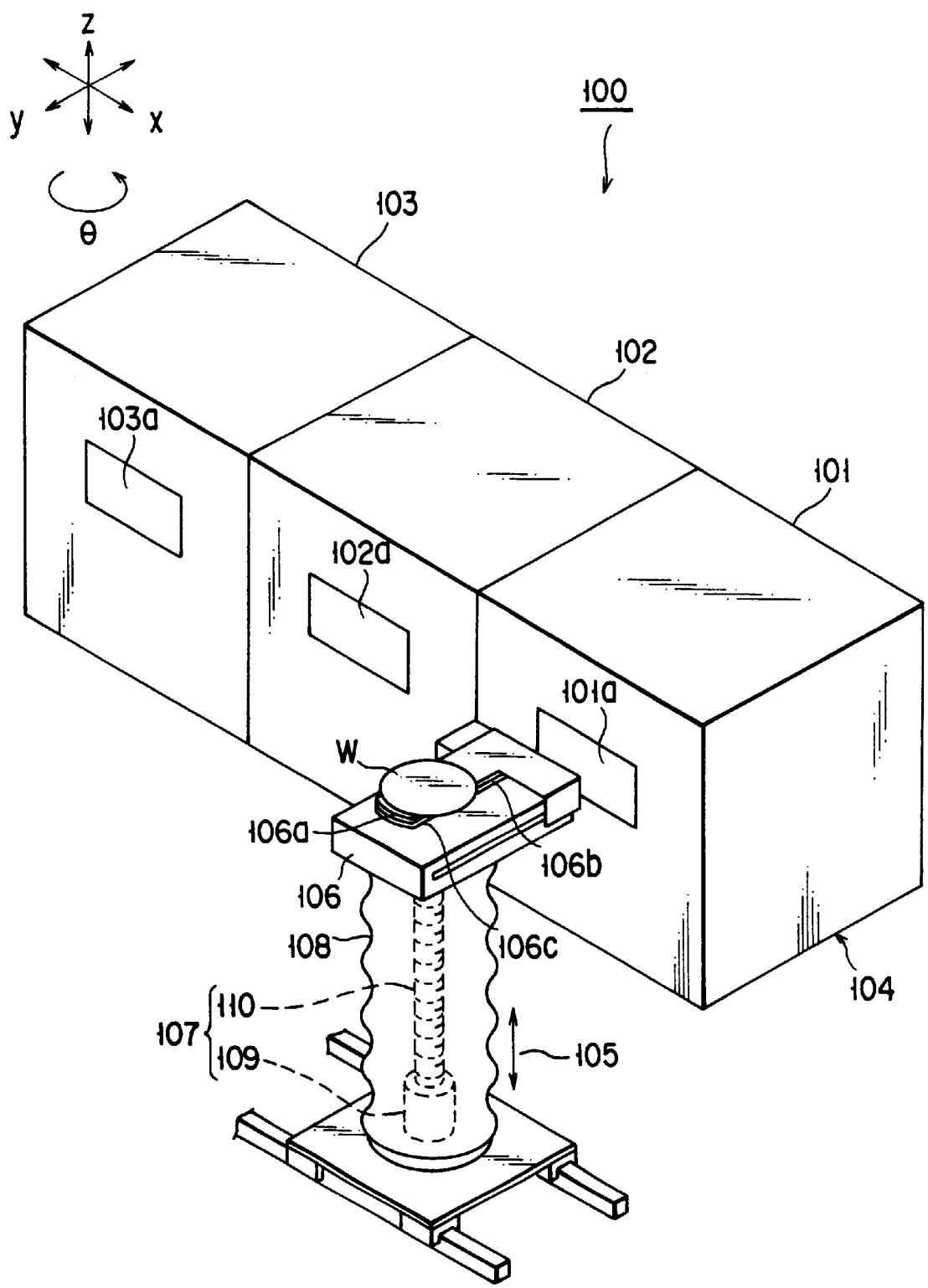
FIG. 1 is a schematic perspective view of a conventional substrate transport apparatus.
Figure 2:
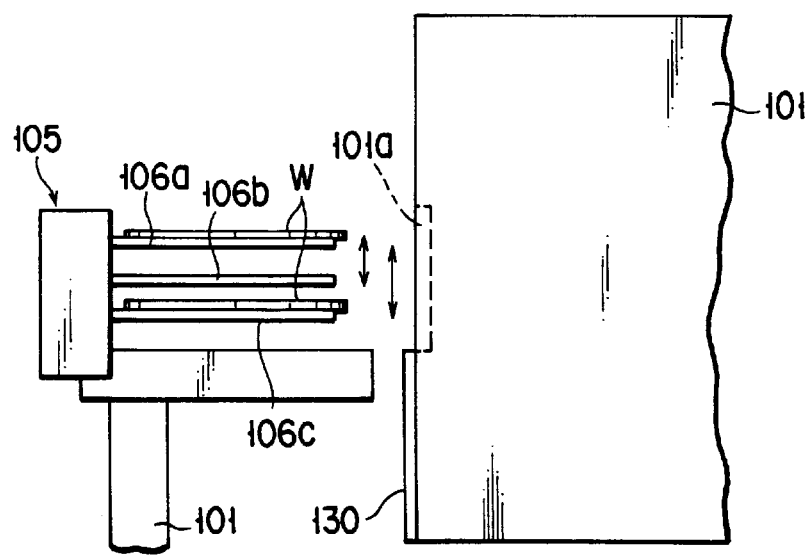
FIG. 2 is a schematic side view of the conventional substrate transport apparatus.

In addition, since the distance between each of the driving mechanisms 23, 24, 47 and the bottom exhaust port 30b is reduced, the efficiency in evacuating the inner space 48 of the cover assembly is tremendously increased. As a result, the amount of the particles generated in the cover assembly of the present invention is significantly reduced as particularly compared to the conventional cover 108 (see FIG. 1) in the bellows form.

Furthermore, since the slide cover 22c of a larger diameter is placed upper than the slide covers 22a, 22b of a small diameter, the chemical washing solution does not enter the inner space 48 even if leakage of the solution occurs. The driving mechanism 47 within the inner space can be protected.

Furthermore, since the second and third slide covers 22b, 22c are synchronously moved up and down, the arm portion 20 is quickly allowed to arrive at the load/unload port 101a (102a, 103a) of the processing unit, increasing the throughput. Moreover, since the single motor 42 is commonly used by two ball screws 33, 34, the substrate transport apparatus 4 can be reduced in size.

The plurality of processing units can be used in various combination depending upon the washing conditions. For example, a certain unit can be withdrawn from the processing units and conversely another unit may be added. In the substrate processing system, the number of processing units required for processing the wafer W may be used alone or in combination of two or three.

Figure 11:
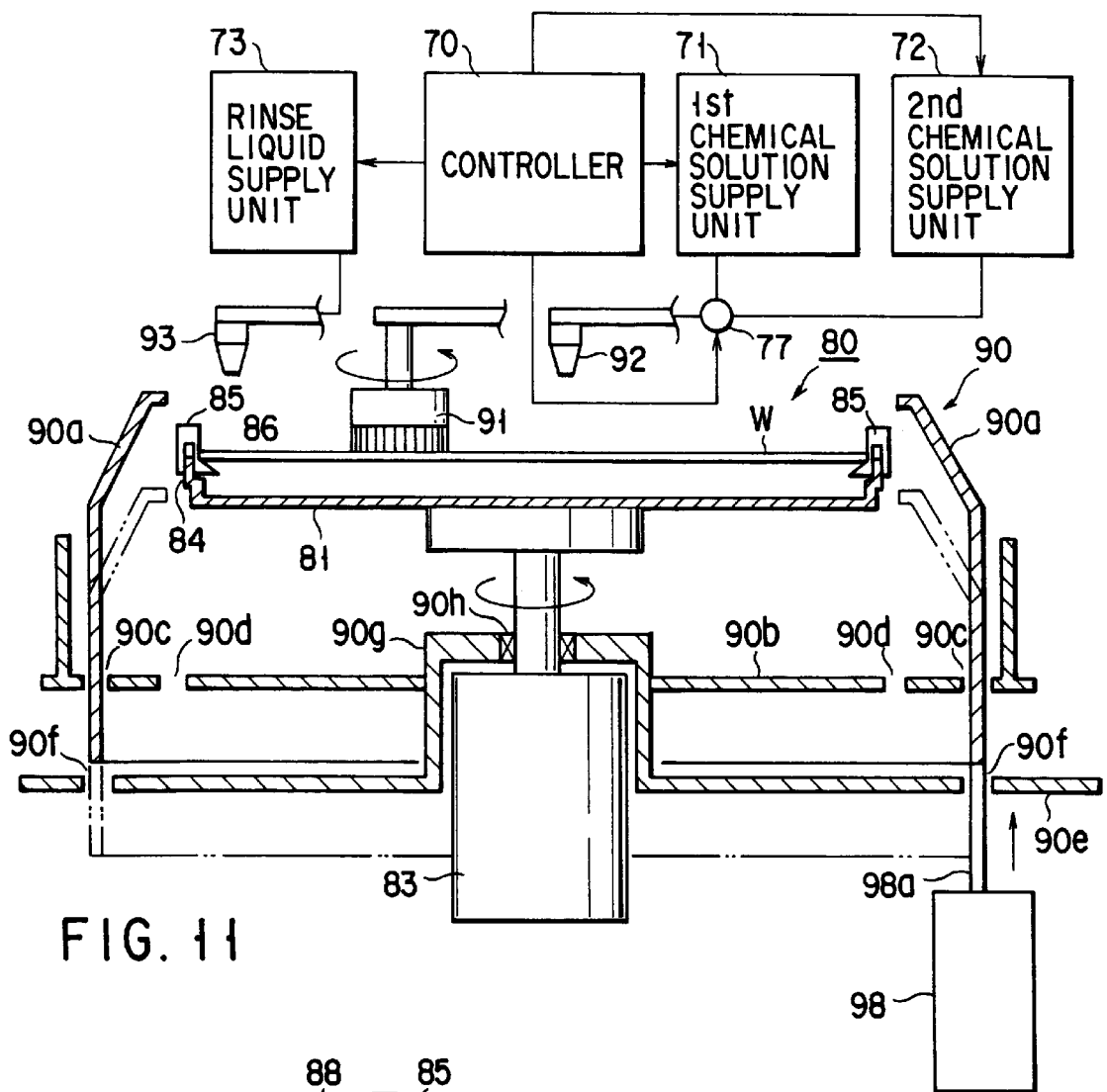
FIG. 11 is a cross sectional view of a washing unit for washing a surface of a semiconductor wafer with a chemical solution, accompanying a block diagram of peripheral elements.

Now, the processing unit will be explained with reference to FIGS. 11 and 12. The processing units 6–11 have substantially the same structure, so that the first and second units 6, 7 will be representatively explained.

In this embodiment, a mechanical chuck 80 is used as a substrate holding portion. As shown in FIG. 11, the mechanical chuck 80 is provided within a drain cup 90. The drain cup 90 has a movable cup portion 90a and unmovable cup portion 90b. The movable cup portion 90a is connected to a rod 98a of a cylinder 98 through openings 90c, 90f. When the rod 98a is allowed to protrude from the cylinder 98, the movable cup portion 90a moves up. Conversely, when the rod 98a is withdrawn within the cylinder 98, the movable cup portion 90a moves down.

A rotatory driving shaft 83a of a motor 83 is passed through the center protruding portion 90g of the unmovable cup portion 90b and connected to a bottom plate 81 of the mechanical chuck 80. A seal bearing 90h is interposed between the rotatory driving shaft 83s and the center protruding portion 90g. Drain holes 90d are appropriately formed in the unmovable cup 90b. The washing drainage is discarded outside of the cup 80 through the drain holes 90d.

The bottom plate 81 of the mechanical chuck 80 has the same size as the diameter of the wafer W. Six elected portions 84 are provided in the periphery of the bottom plate 81. A wafer holding portion 85 is provided to each of the elected portions 84. The lower half inner peripheral portion of the wafer holding portion 85 is inclined inwardly to form an inclined surface. The outer periphery of the wafer is in contact with the upper side of the inclined surface of the wafer holding portion 85. The wafer holding portion 85 is attached to the elected portion 84 via a horizontal axis 86. In addition, a weight (not shown) is housed in the wafer holding portion 85.

Figure 12:
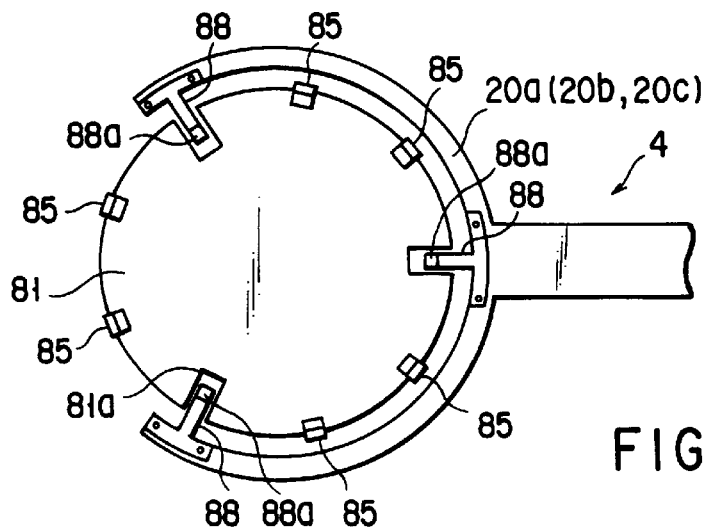
FIG. 12 is a plan view of an arm and an spin chuck.

The wafer W is transferred to the mechanical chuck 80 by the transfer arm 20a (20b, 20c) shown in FIG. 12. The transfer arm 20a (20b, 20c) is a ring member (partly cut-away), whose inner diameter is larger than that of the bottom plate 81. A wafer mounting portion 88 extending inwardly is provided at three portions inside the ring member. The wafer W is mounted on the protruding portion 88a formed on the tip portion of the wafer mounting portion 88.

A cut-away portion 81a is formed at the bottom plate 81 corresponding to the wafer mounting portion 88 so as to pass the wafer mounting portion 88. The wafer held by the transfer arm 20a (20b, 20c) is transferred to the wafer holding portion 85 of the mechanical chuck 80 by moving down the transfer arm 20a (20b, 20c) from a predetermined position above the mechanical chuck 80 and passing through the cut away portion 81a.

A disk brush 91 is movably supported by a moving mechanism (not shown) via the arm 91a. A first nozzle 92 is movably supported by a moving mechanism (not shown) via an arm 92a. Furthermore, a second nozzle 93 is movably supported by a moving mechanism (not shown) via an arm 93a. The brush 91 and the nozzles 92, 93 are moved from home positions to operation positions by respective moving mechanisms so as to be faced to the wafer W.

The first nozzle 92 is independently communicated with chemical solution supply sources 71, 72, by way of a switching valve 77. For example, the first chemical solution supply source 71 of the first processing unit 6 contains an ammonia/hydrogen peroxide solution mixture (hereinafter, referred to "APM solution"). The second chemical washing solution supply source 72 thereof contains a hydrochloric acid/hydrogen peroxide solution mixture (hereinafter, referred to as "HPM solution"). The power supply circuit of the switching valve 77 is connected to the controller 70. The controller 70 controls operation of the switching valve 77 on the basis of input data of processing conditions to switch a processing solution to be supplied to the first nozzle 92 between the APM solution and the HPM solution.

On the other hand, the first chemical washing supply source 71 of the second processing unit 7, contains ammonia/hydrogen peroxide solution mixture (hereinafter, referred to "APM solution"). The second chemical washing supply source 72 thereof contains a hydrofluoric acid solution (hereinafter, referred to as "DHF solution"). The controller controls operation of the switching valve 77 on the basis of input data of processing conditions so as to switch the processing solution to be supplied to the first nozzle 92 between the APM solution and the DHF solution.

The second nozzle 93 is communicated with a rinse solution supply source 73 serving as a third solution supply source. The rinse solution supply source 73 contains pure wafer. Each of the solution supply sources 71, 72, 73 houses a flow rate controller. The controller 70 controls each of operations of the solution supply sources 71, 72, 73 and adjusts the flow rate of supplying the processing solution.

Note that the solution supply sources 71, 72 of other processing units 8, 9, 10, 11 contain any one of the APM solution, HPM solution, and DHF solution.

Figure 13:
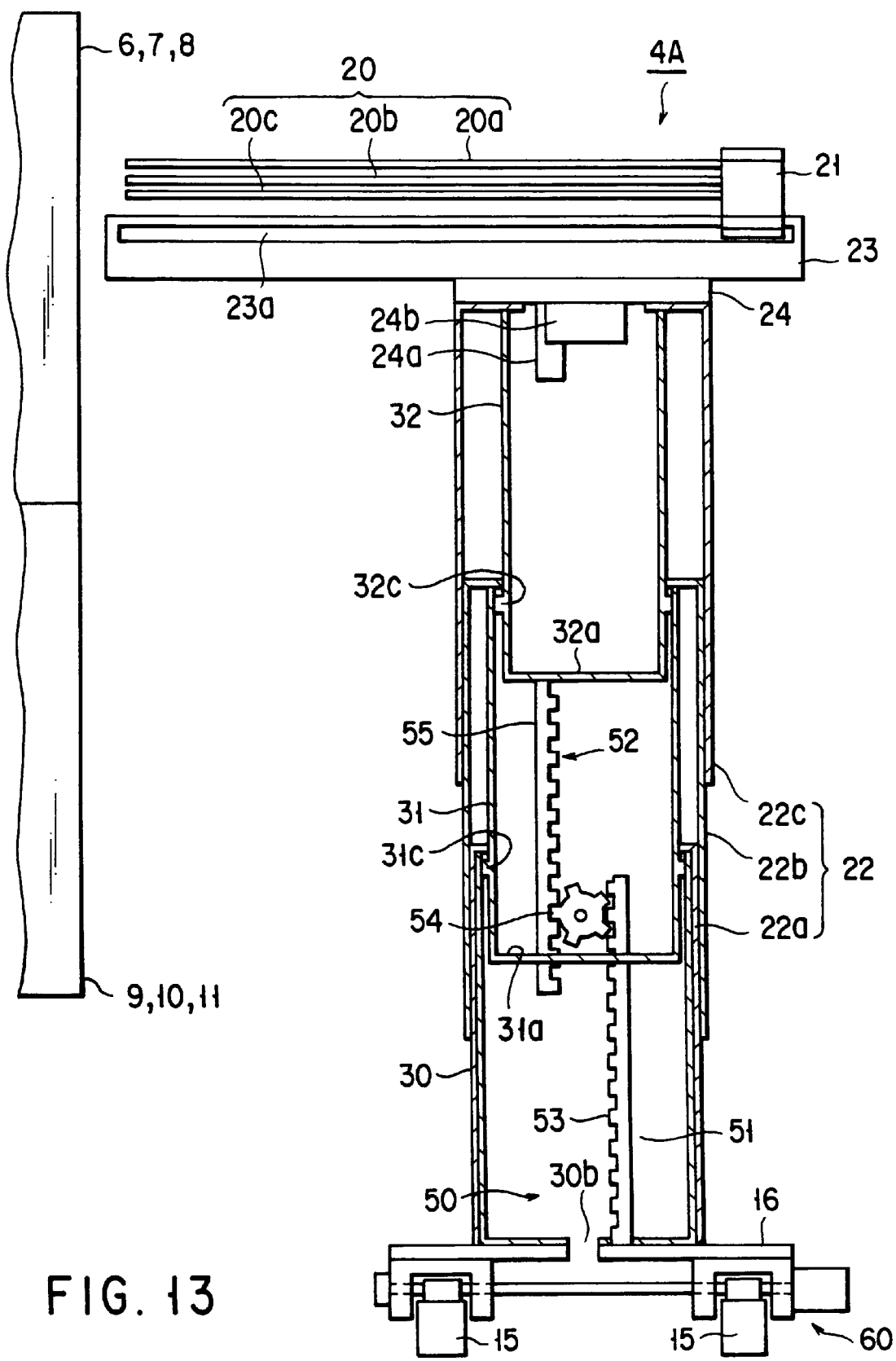
FIG. 13 is a cross sectional view of a substrate transfer apparatus according to another embodiment of the present invention, accompanying a block diagram of peripheral elements.

Next, a substrate transport apparatus 4A of another embodiment will be explained with reference to FIG. 13.

The substrate transport apparatus 4A has a Z-axis driving mechanism 50 as a means for moving the arm portion 20 up and down. The Z-axis driving mechanism 50 has a first and second rack/pinion mechanisms 51, 52. The first rack/pinion mechanism 51 moves the second slide cover 22b up and down with respect to the slide cover 22a. The second rack/pinion mechanism 52 moves the third slide cover 22c up and down with respect to the second slide cover 22b.

The first rack/pinion mechanism 51 has a first rack 53 and common pinion 54 which are engaged with each other. The second rack/pinion mechanism 52 has a second rack 55 and a common pinion 54 which are engaged with each other. The shaft of the common pinion 54 is connected to a rotatory driving shaft (not shown) of a motor (not shown) via a speed-reducing mechanism (not shown). The first rack 53 is fixed on the base plate 16 and the first slide cover 22a at the lower end. The upper portion of the first rack 53 passes through the bottom portion 31a and reaches within the first movable support member 31. The second rack 55 is fixed to the bottom portion 32a of the second movable support member at the upper end. The lower portion of the second rack 55 passes through the bottom portion 31a and reaches within the unmovable support member 30. Note that the first and second racks 53, 55 pass through guide holes (not shown) formed in the bottom portion 31a.

Figure 14:
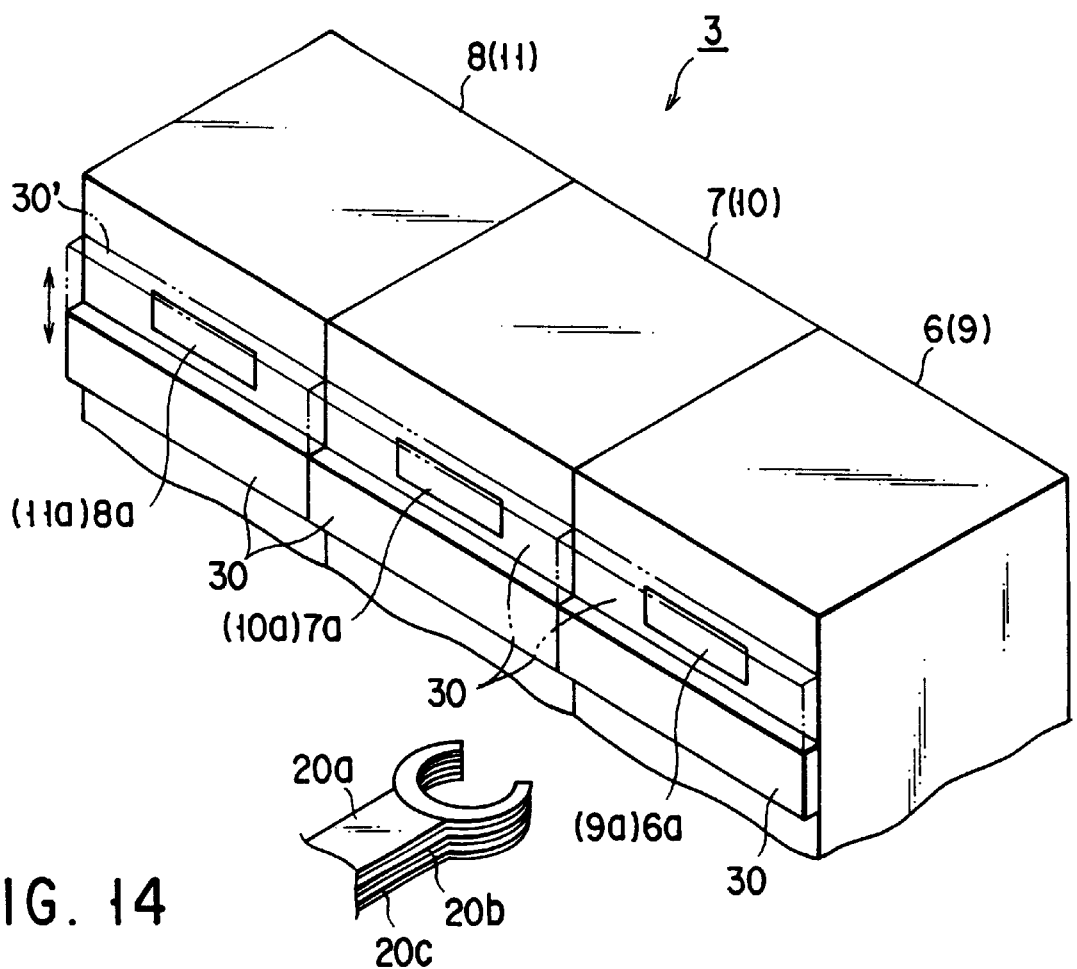
FIG. 14 is a perspective view of the substrate transport apparatus and the washing unit.
Figure 15:
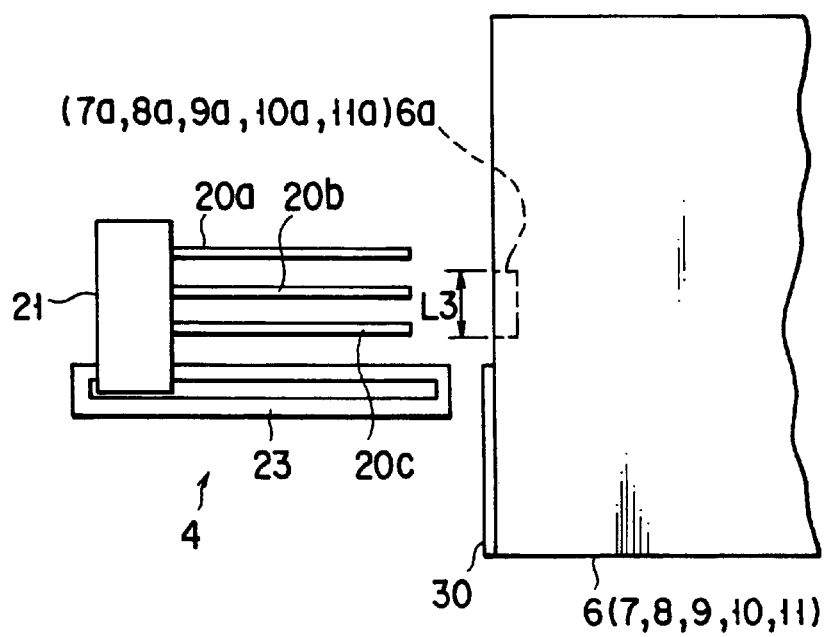
FIG. 15 is a schematic view of a substrate transport apparatus facing the washing unit.
Figure 16:
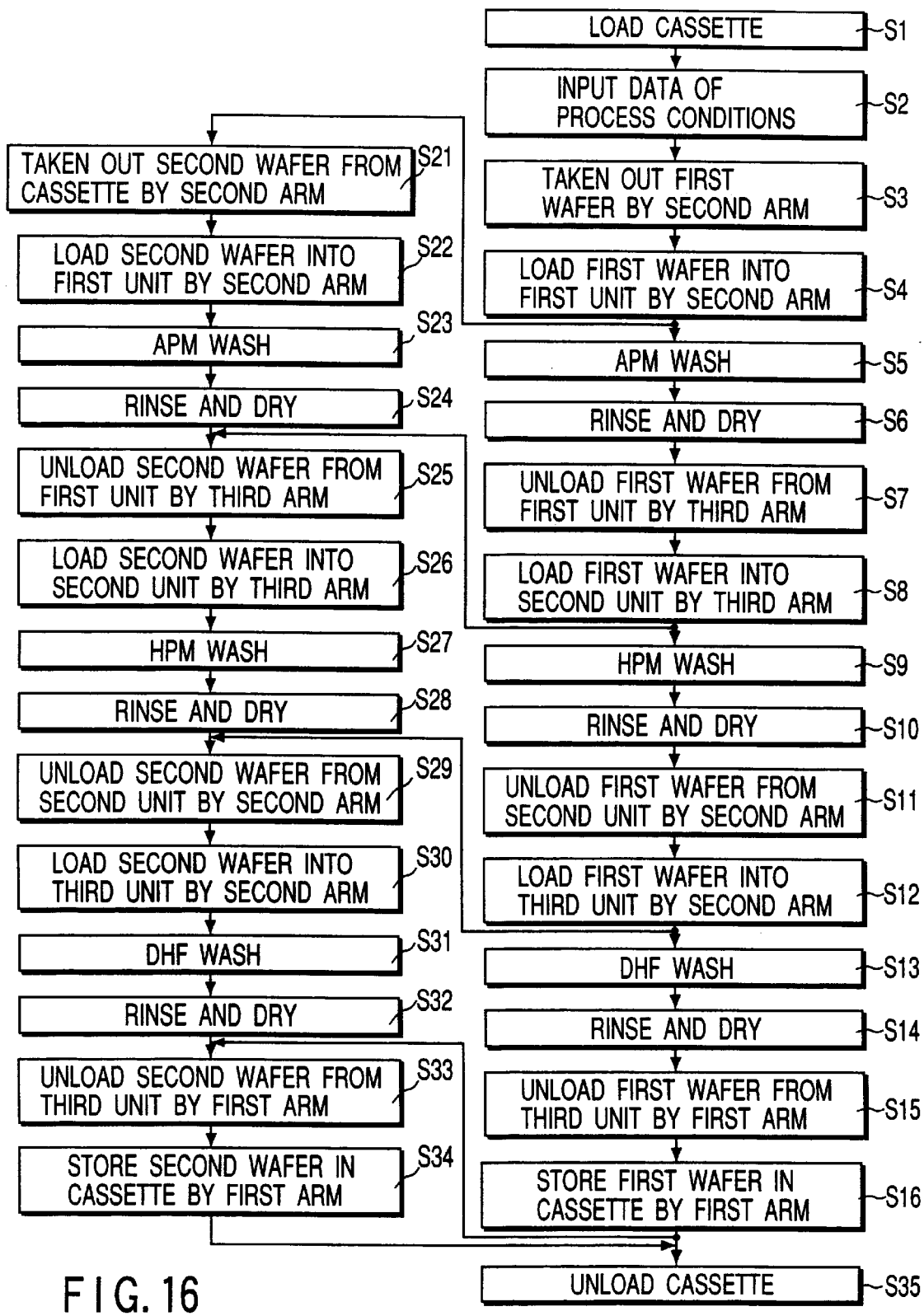
FIG. 16 is a flow chart showing the steps of a method for transporting a substrate according to an embodiment of the present invention.

As shown in FIGS. 14 and 15, the first, second, third units 6, 7, 8 respectively have load/unload ports 6a, 7a, 8a in the front surfaces. Longitudinal size L3 of the load/unload port 6a (7a, 8a) is sufficiently large to load at least two arms 20a, 20c simultaneously into the processing unit 6 (7, 8). In other words, it is desirable that L3 correspond the height of two arms 20a and 20b (alternatively, 20b and 20c). For example, when the wafer w of 12 inches is used, the longitudinal size L3 of the load/unload port 6a (7a, 8a) ranges from about 50 to 80 mm. With this structure, even when the wafer is loaded/unloaded, it is difficult for particles to enter the processing unit 6 from the outside.

A shutter 30 is attached to each of the load/unload ports 6a, 7a, 8a. Each of the shutters is moved up and down by a cylinder mechanism (not shown) provided thereunder. The moving stroke of the shutter 30 corresponds to the distance between adjacent arms 20a and 20b vertically arranged (alternatively, 20b and 20c).

Now, we will explain the case where the wafer W is subjected to washing treatment odd number of times by using all of three processing units 6, 7, 8, with reference to FIGS. 16, 17A to 17F.

First, a cassette C is loaded into the loader/unloader section 2 by a transport robot (not shown) (Step S1). The cassette C stores 25 sheets of unprocessed semiconductor wafers W (8 inch or 12 inch in diameter). An identification code having data of wafer processing conditions recorded thereon, is displayed in appropriate portion of the cassette C. The optical sensor (not shown) reads the identification code and input the read data into the controller 70 (Step S2). The controller determines that the number of the processing units applied to treat the lot is odd number on the basis of input data of the processing conditions. Based on the determination results, and then, sends instruction signals to the substrate transport apparatus 4 and washing unit 3.

As shown in FIG. 9, while the cover 22 is shrunk most, the tip portion of the arm portion 20 is faced toward the loader/unloader portion 2. The second slide cover 22b and the third cover 22c are simultaneously moved up until the height of the arm portion 20 becomes equal to the level of the load/unload port 6a (7a, 8a) of the processing unit. In this manner, the cover 22 is quickly extended. As shown in FIG. 8, the arm portion 20 is moved up to the level of the cassette C to introduce the second arm 20b into the cassette C. Subsequently, the second arm 20b is moved forward to take out a first wafer W1 from the cassette C by the second arm 20b (Step S3).

When the arm portion 20 is moved down, the second slide cover 22b and the third slide cover 22c are simultaneously moved down by rotating the motor 42 backward. In this way, the cover 22 is quickly shrunk as shown in FIG. 9.

Figure 17A:
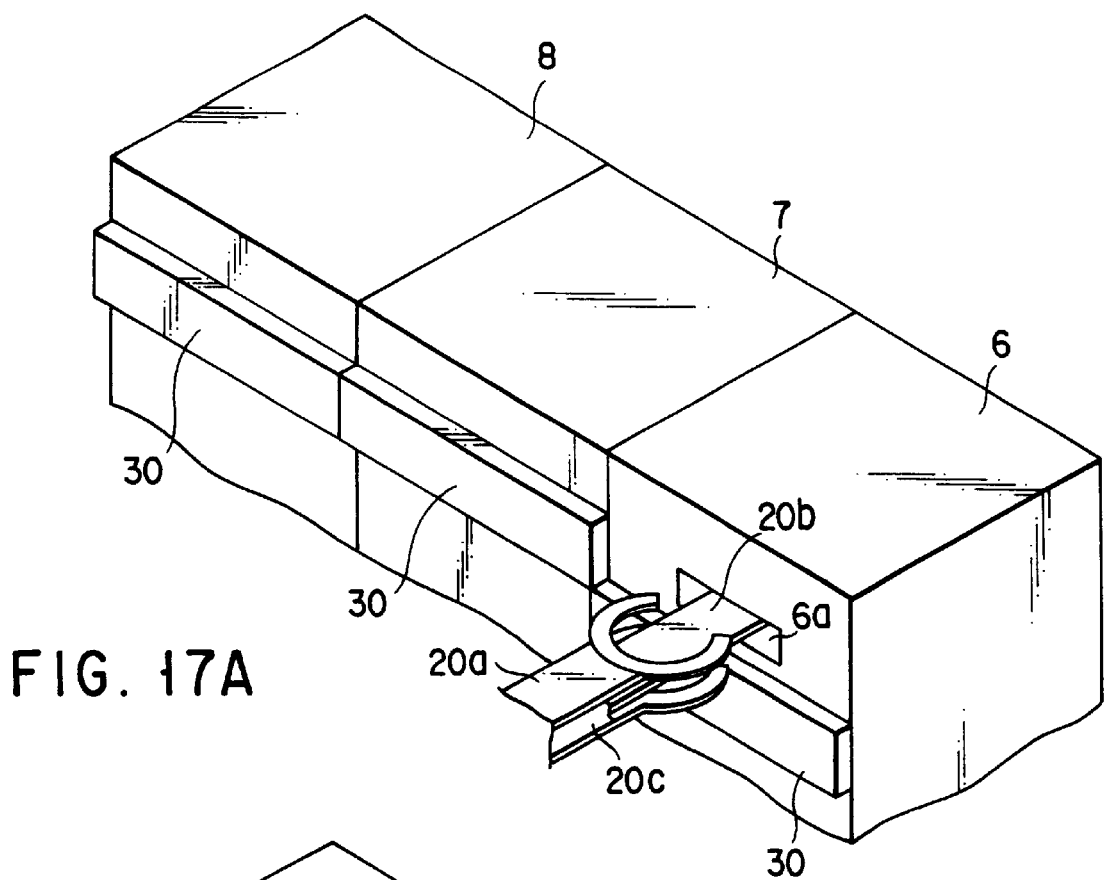
FIGS. 17A to 17F are perspective views showing the substrate transfer apparatus and the washing unit for explaining how to transfer a wafer when an odd number of the steps is required for washing process.

As shown in FIG. 17A, the shutter 30 of the first unit 6 is moved down to load the wafer W1 into the first unit 6 through the load/unload port 6a (Step S4). When the first wafer W1 is transferred onto the spin chuck 80, the second arm 20b is withdrawn and then, the load/unload port 6a is closed. Subsequently, while the wafer W1 is rotated by the spin chuck 80 and the ammonia/hydrogen peroxide solution mixture is supplied to the wafer W1 from the first nozzle 92, the wafer W1 is rubbed by the rotation brush 91 to wash the surface of the wafer W1 with the APM solution (Step S5). After completion of the APM washing, pure wafer serving as a rinse solution is supplied from the second nozzle 93 to the wafer W1 to rinse the wafer W1. Furthermore, the wafer W1 is rotated at a high speed by the spin chuck 80 to separate and remove the attached solution from the wafer W1 (Step S6). In this manner, the surface of the first wafer W1 is dried.

Figure 17B:
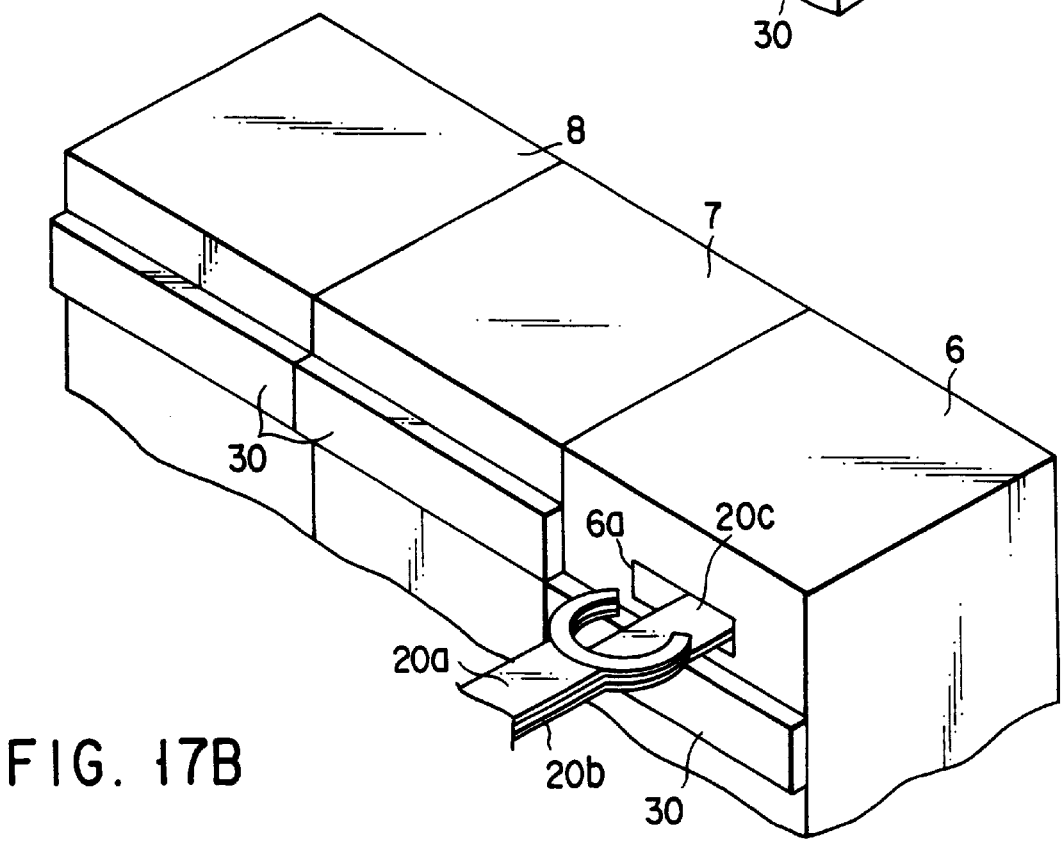

Subsequently, the load/unload port 6a is opened. Then, the third arm 20c is inserted into the first unit 6 to unload the first wafer W1 from the first unit 6 by the third arm 20c, as shown in FIG. 17B (Step S7). During this period, the wafer W2 is taken out from the cassette C in advance by the second arm 20b and the wafer W1 is loaded into the second unit 7 by the third arm 20c.

Figure 17C:
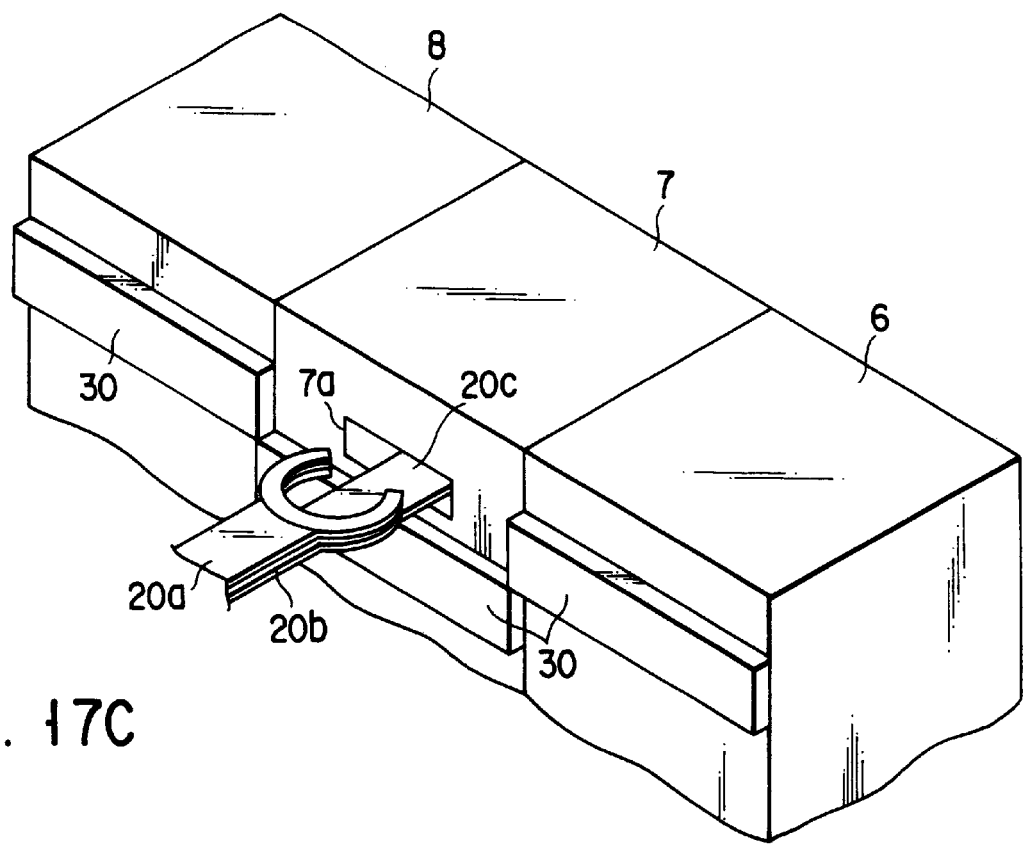

Furthermore, as shown in FIG. 17C, the load/unload port 7a of the second unit 7 is opened to load the first wafer W1 into the second unit 7 by the third arm 20c (Step S8). When the first wafer W1 is transferred onto the spin chuck 80, the third arm 20c is withdrawn and the load/unload port 7a is closed. Subsequently, while the wafer W1 is rotated by the spin chuck 80 and a hydrochloric acid/hydrogen peroxide solution mixture is supplied to the wafer W1 from the first nozzle 92, the wafer W1 is rubbed by the rotation brush 91 to wash the surface of the wafer W1 with the HPM solution (Step 9).

After completion of the HPM washing solution, pure water serving as a rinse solution is supplied to the wafer W1 from the second nozzle 93 to rinse the wafer W1. Furthermore, the wafer W1 is rotated at a high. speed by the spin chuck 80 to separate and remove the attached solution from the wafer W1 (Step S10). In this manner, the surface of the first wafer W1 is dried.

On the other hand, the wafer W2 to be used next is taken out in advance by the second arm 20b from the loader/unloader section 2 during the period between the step S5 and S6 (Step S21). As shown in FIG. 17B, the shutter 30 of the first unit 6 is moved down to load the second wafer W2 into the first unit 6 through the load/unload port 6a (Step S22). When the second wafer W2 is transferred onto the spin chuck 80, the second arm 20b is withdrawn and the shutter 30 is moved up and then, the load/unload port 6a is closed. Subsequently, while the wafer W2 is rotated by the spin chuck 80 and the ammonia/hydrogen peroxide solution mixture is supplied to the wafer W2 from the first nozzle 92, the wafer W2 is rubbed by the rotation brush 91 to wash the surface of the wafer W2 with an APM solution (Step S23). After completion of the APM washing, pure wafer serving as a rinse solution is supplied to the wafer W2 to rinse the wafer W2. Furthermore, the wafer W2 is rotated at a high speed by the spin chuck 80 to separate and remove the attached solution from the wafer W2 (Step S 24). In this manner, the surface of the second wafer W2 is dried.

Then, the load/unload 6a of the first unit 6 is opened. Subsequently, the third arm 20a is inserted into the first unit 6 to unload the second wafer W2 from the first unit 6 by the third arm 20c, as shown in FIG. 17B (Step S25). Furthermore, as shown in FIG. 17C, the load/unload port 7a of the second unit 7 is opened to load the second wafer W2 into the second unit 7 by the third arm 20c (Step S26). When the second wafer W2 is transferred onto the spin chuck 80, the third arm 20c is withdrawn and the shutter 30 is moved up to close the load/unload port 7a. While the wafer W2 is rotated by the spin chuck 80 and the hydrochloric acid/hydrogen peroxide solution mixture is supplied from the first nozzle 92 to the wafer W2, the wafer W2 is rubbed by the rotation brush 91 to wash the surface of the wafer W2 with the HPM solution (Step S27). After completion of the HPM washing, pure water serving as a rinse solution is supplied to the wafer W2 to rinse the wafer W2. Furthermore, the wafer W2 is rotated at a high speed by the spin chuck 80 to separate and remove the attached solution from the wafer W2 (Step S28). In this manner, the surface of the wafer W2 is dried.

Figure 17D:
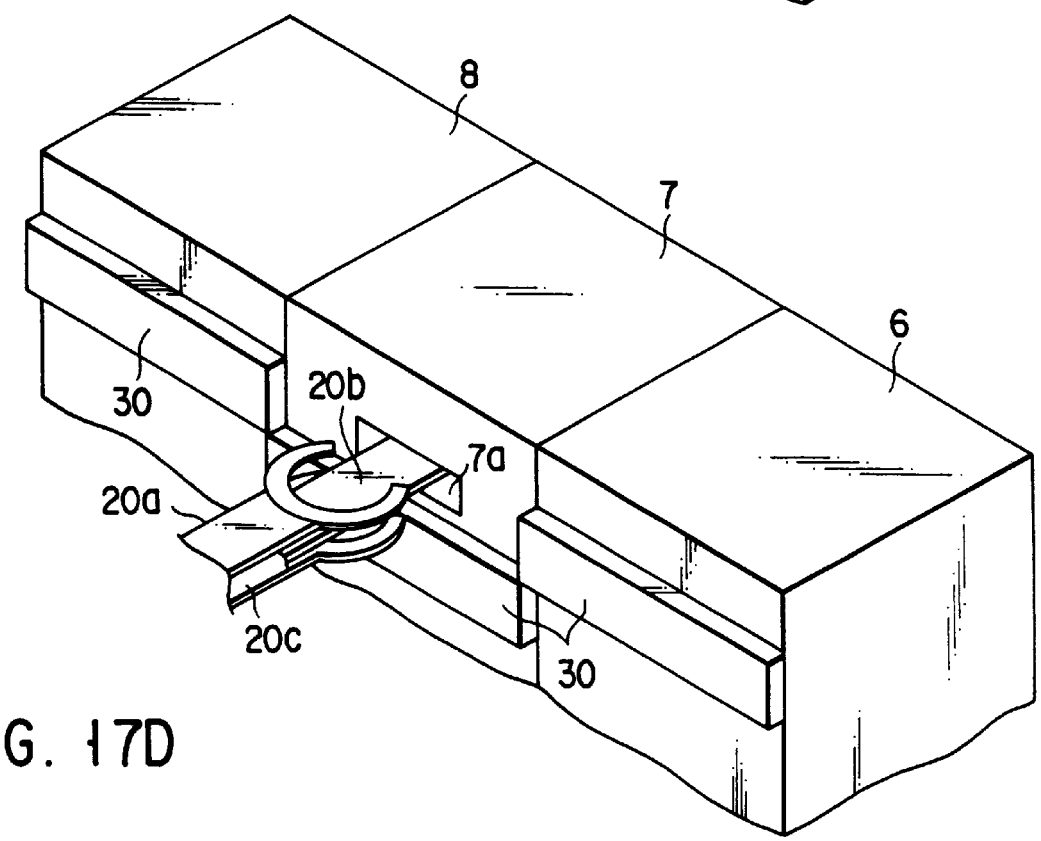
Figure 17E:
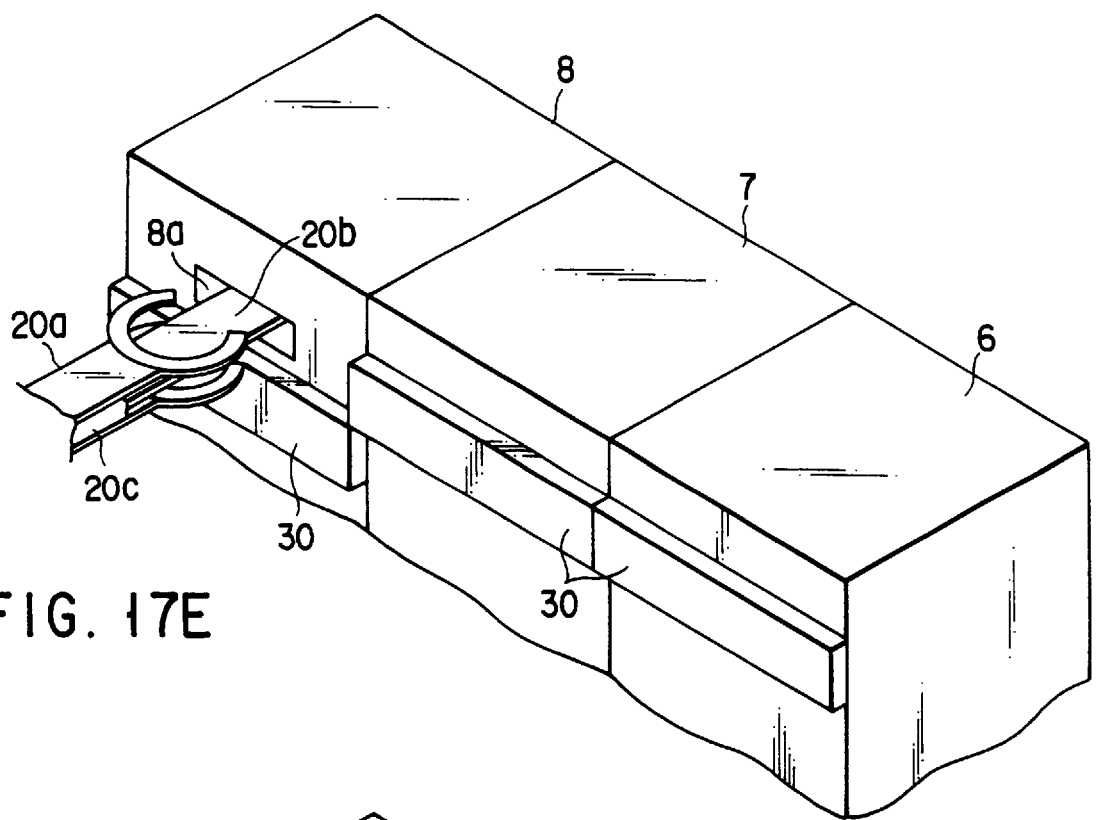

Before the step S26, the load/unload port 7a of the second unit 7 is opened. Subsequently, the second arm 20b is inserted into the second unit 7 to unload the first wafer W1 from the second unit 7 by the second arm 20b, as shown in FIG. 17D (Step S11). Furthermore, as shown in FIG. 17E, the load/unload port 8a of the third unit 8 is opened to load the first wafer W1 into the third unit 8 by the second arm 20b (Step S12). When the first wafer W1 is transferred onto the spin chuck 80, the second arm 20b is withdrawn and the load/unload port 8a is closed. While the wafer W1 is rotated by the spin chuck 80 and the hydrofluoric acid solution is supplied to the wafer W1 from the first nozzle 92, the wafer W1 is rubbed by the rotation brush 91 to wash the surface of the wafer W1 with the DHF solution (Step S13). After completion of the DHF washing, pure wafer serving as a rinse solution is supplied from the second,nozzle 93 to the wafer W1 to rinse the wafer W1. Furthermore, the wafer W1 is rotated at a high speed by the spin chuck 80 to separate and remove the attached solution from the wafer W1 (Step S14). In this manner, the surface of the first wafer W1 is dried.

Figure 17F:
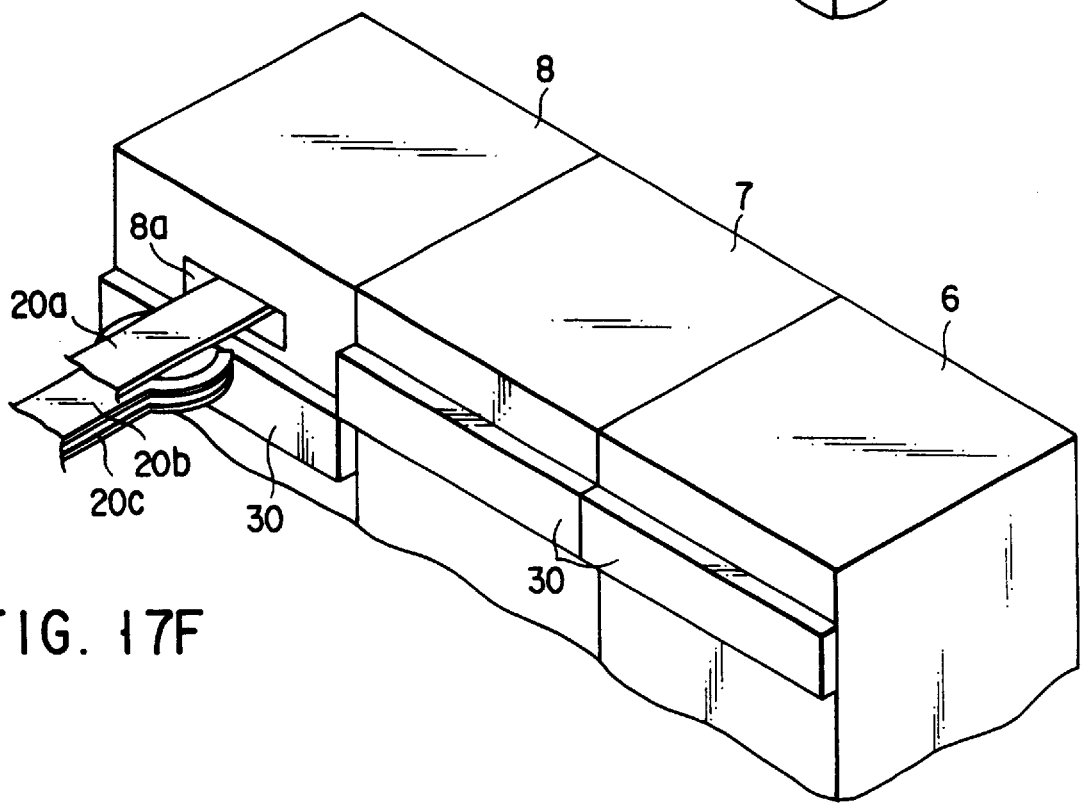
Figure 18:
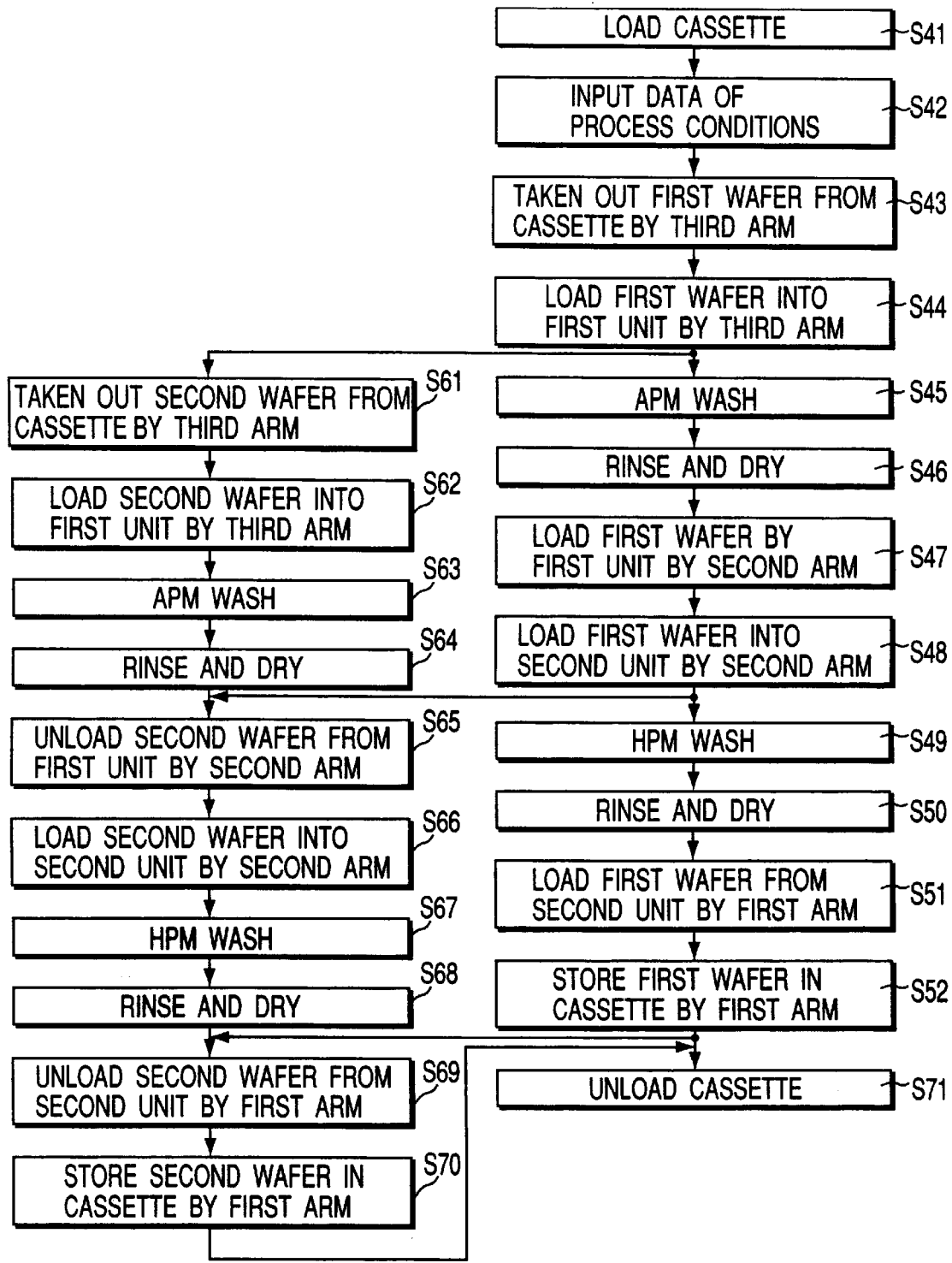
FIG. 18 is a flow chart showing the steps of a method for transporting a substrate according to another embodiment of the present invention.

The load/unload port 8a of the third unit 8 is opened. Subsequently, the first arm 20a is inserted into the third unit 8 to unload the first wafer W1 from the third unit 8 by the first arm 20a (Step S 15), as shown in FIG. 17F. The substrate transport apparatus 4 is again faced to the loader/unloader section 2 from the washing unit 3. Then, the first arm 20a is moved forward to store the first wafer W1 in the cassette C (Step S16).

After the step S15, the load/unload port 7a of the second unit 7 is opened. Subsequently, the second arm 20b is inserted into the second unit 7 to unload the second wafer W2 from the second unit 7 by the second arm 20b, as shown in FIG. 17D (Step S29). Furthermore, as shown in FIG. 17E, the load/unload port 8a of the third unit 8 is opened to load the second wafer W2 into the third unit 8 by the second arm 20b (Step S30). When the second wafer W2 is transferred onto the spin chuck 80, the second arm 20b is withdrawn and the load/unload port 8a is closed. While the wafer W2 is rotated by the spin chuck 80 and the hydrofluoric acid solution is supplied to the wafer W2 from the first nozzle 92, the wafer W2 is rubbed by the rotation brush 91 to wash the surface of the second wafer W2 with the DHF solution (Step S31). After the DHF washing, pure wafer serving as a rinse solution is supplied to the wafer W2 from the second nozzle 93 to rinse the wafer W2. Furthermore, the wafer W2 is rotated at a high speed by the spin chuck 80 to separate and removed the attached solution from the wafer W2 (Step S32). In this manner, the surface of the second wafer W2 is dried.

The load/unload port 8a of the third unit 8 is opened. Subsequently, the first arm 20a is inserted into the third unit 8 to unload the second wafer W2 from the third unit 8 by the first arm 20a, as shown in FIG. 17F (Step S33). Then, the substrate transport apparatus 4 is again faced to the loader/unloader section 2 from the washing section 3. The first arm 20 a is moved forward to store the second wafer W2 in the cassette C (Step S34). While up-and-down movement of the arm portion 20 of the substrate transport apparatus 4 is repeated, the wafer W is transferred to the processing units 9, 10, 11 in the lower stage of the substrate transport apparatus 4 and the wafer W is transferred to the processing units 6, 7, 8 in the upper stage thereof.

After the washed first wafer W1 to 25th wafer W25 are continuously stored in the cassette C, the cassette C is unloaded from the system 1 through the loader/unloader portion 2 by the transport robot (not shown) and load into a next process (Step S35).

Now, we will explain the case in which the wafer W is washed even-number of times (twice) by using two processing units 7, 8, with reference to FIGS. 18 and 19A to 19D.

The cassette C is loaded into the loader/unloader section 2 by the transport robot (not shown) (Step S41). The cassette C stores 25 sheets of the semiconductor wafers W. An identification code having processing data of the wafer W recorded thereon, is displayed at an appropriate portion of the cassette C. The identification code is read by an optical sensor (not shown) and the data read out is input into the controller (Step S42). The controller 70 determines that the processing units required for treating the lot is even times (twice) on the basis of the input data. Based on the determination results, the controller 70 sends instruction signals to the substrate transport apparatus 4 and the washing unit 3, respectively.

As shown in FIG. 9, while the cover 22 is most shrunk, the tip portion of the arm section 20 is faced to the loader/unloader section 2. Furthermore, the second slide cover 22b and the third slide cover 22c are simultaneously moved up until the height of the arm portion 20 becomes equal to the level of the load/unload port 6a (7a and 8a) of the processing units. In this way, the cover 22 is quickly extended. As shown in FIG. 8, the arm portion 20 is moved up to the level of the first processing unit 6 at one stroke to allow the third arm 20c to enter the second processing unit 7. Subsequently, the third arm 20c is moved forward to take out the first wafer W1 from the cassette C by the third arm 20c (Step S43). When the arm portion 20 is moved down, the motor 42 is rotated backward to move the second and third slide covers 22b, 22c simultaneously. In this manner, the cover 22 is quickly shrunk as shown in FIG. 9.

Figure 19A:
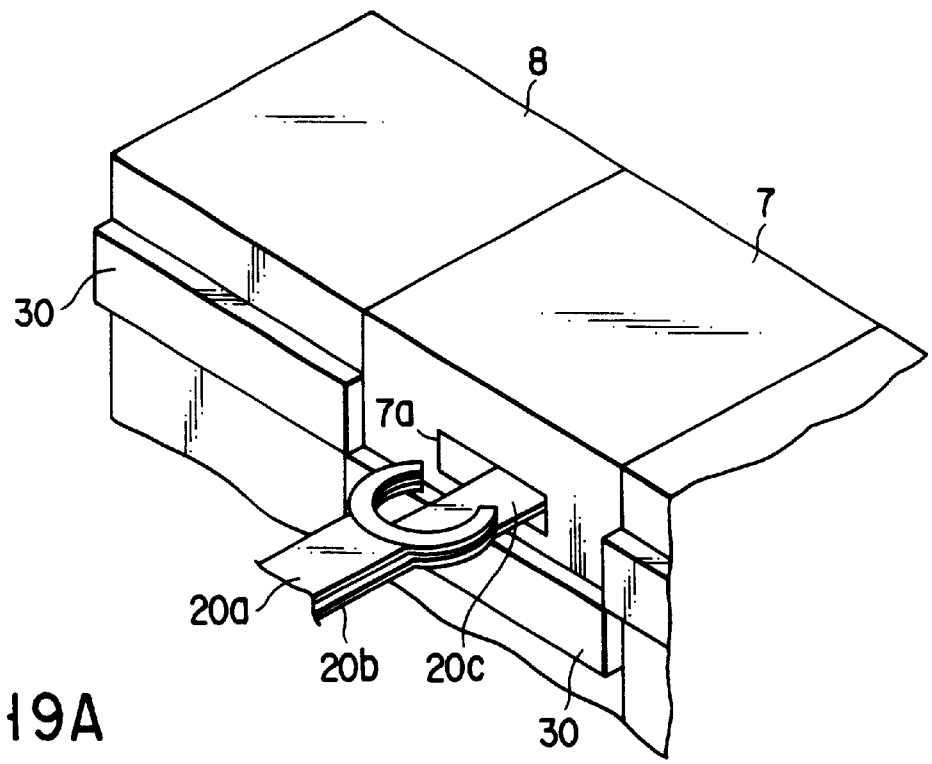
FIGS. 19A to 19D are perspective views showing the substrate transfer apparatus and the washing unit for explaining how to transfer a wafer when an even number of the steps is required for washing process.

As shown in FIG. 19A, the shutter 30 of the second unit 7 is moved down to load the first wafer W1 into the second unit 7 through the load/unload port 7a by the third arm 20c (Step S44). The first wafer W1 is transferred onto the spin chuck 80, the third arm 20c is withdrawn, and then, the load/unload port 7a is closed. Subsequently, while the wafer W1 is rotated by the spin chuck 80 and the ammonia/hydrogen peroxide solution mixture is supplied to the wafer W1 from the first nozzle 92, the wafer W1 is rubbed by the rotation brush 91 to wash the surface of the wafer W1 with the APM solution (Step S45). After completion of the APM washing, pure wafer serving as a rinse solution is supplied from the second nozzle 93 to the wafer W1 to rinse the wafer W1. Furthermore, the wafer W1 is rotated at a high speed by the spin chuck 80 to separate and remove the attached solution from the wafer W1 (Step S46). In this manner, the surface of the first wafer W1 is dried.

Figure 19B:
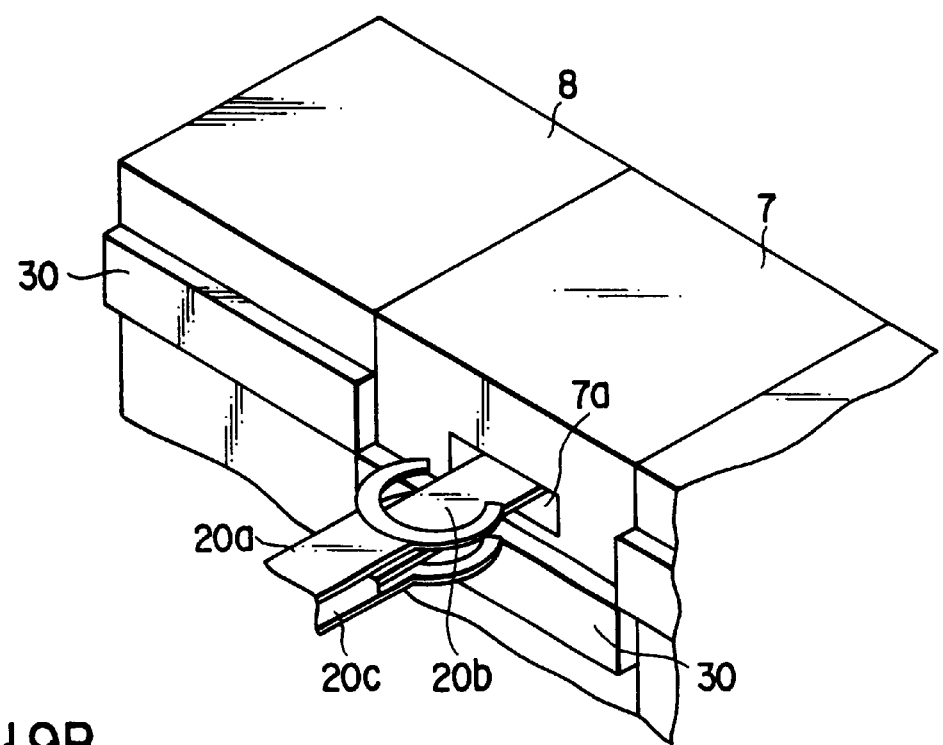

Subsequently, as shown in FIG. 19B, the load/unload port 7a is opened. Then, the second arm 20b is inserted into the second unit 7 to unload the first wafer W1 from the second unit 7 by the second arm 20b, (Step S47).

Figure 19C:
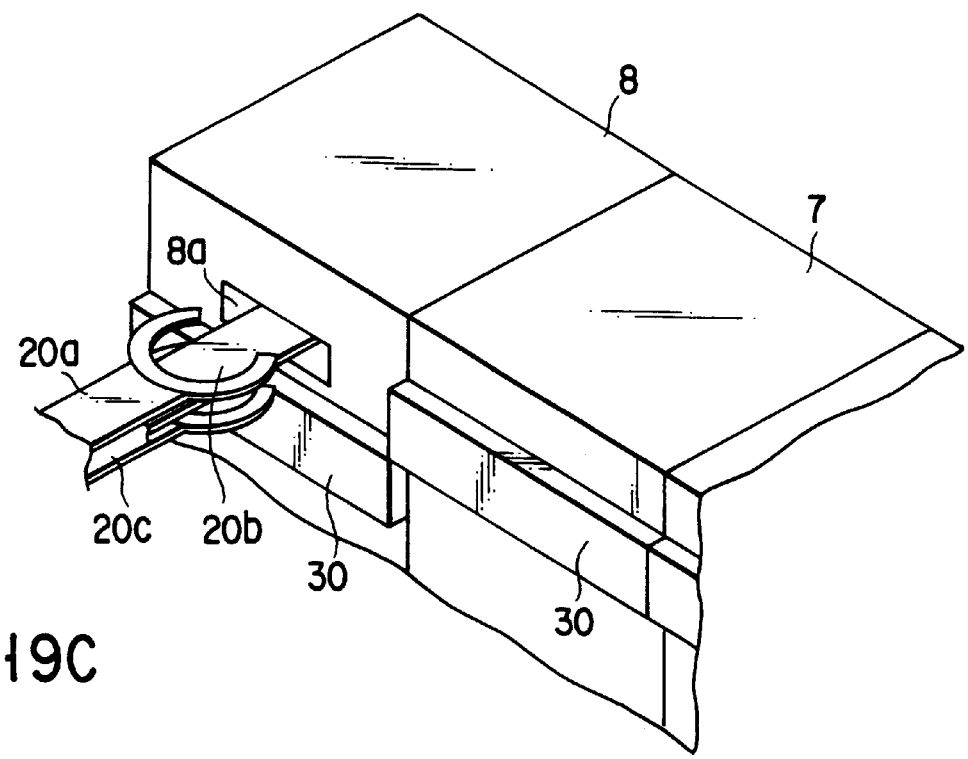

Furthermore, as shown in FIG. 19C, the load/unload port 8a of the third unit 8 is opened to load the first wafer W1 into the third unit 8 by the second arm 20b (Step S48). When the first wafer W1 is transferred onto the spin chuck 80, the second arm 20b is withdrawn and the load/unload port 8a is closed. Subsequently, while the wafer W1 is rotated by the spin chuck 80 and the hydrofluoric acid solution is supplied to the wafer W1 from the first nozzle 92, the wafer W1 is rubbed by the rotation brush 91 to wash the surface of the wafer W1 with the DHF solution (Step 49). After completion of the DHF washing solution, pure water serving as a rinse solution is supplied to the wafer W1 from the second nozzle 93 to rinse the wafer W1. Furthermore, the wafer W1 is rotated at a high speed by the spin chuck 80 to separate and remove the attached solution from the wafer W1 (Step S50). In this manner, the surface of the first wafer W1 is dried.

Figure 19D:
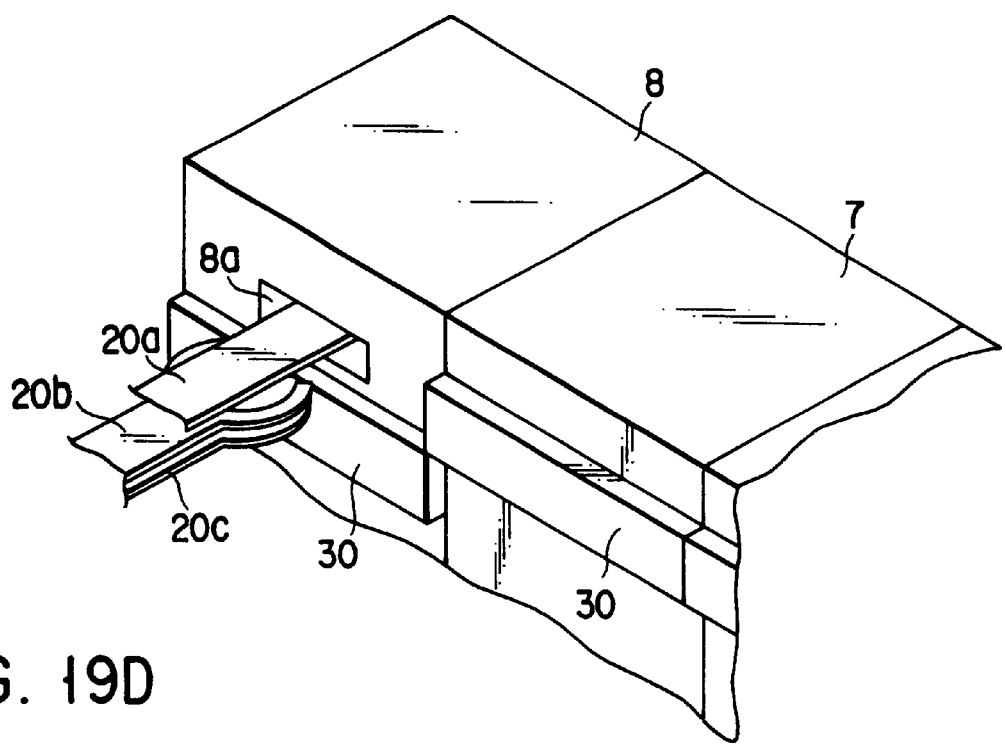

As shown in FIG. 19D, the load/unload port 8a of the third unit 8 is opened. Subsequently, the first arm 20a is inserted into the third unit 8 to unload the first wafer W1 from the third unit 8 by the first arm 20a (Step S51). The substrate transfer apparatus 4 is faced again to the loader/unloader section 2 from the washing unit 3. Subsequently, the first arm 20a is moved forward to store the first wafer W into the cassette C (Step S52).

On the other hand, the third arm 20c takes out the wafer W2 to be used next in advance from the loader/unloader section 2 during the period between the step S45 and S46 (Step S61). As shown in FIG. 19A, the shutter 30 of the second unit 7 is moved down to load the second wafer W2 into the second unit 7 through the load/unload port 7a (Step S62). When the second wafer W2 is transferred onto the spin chuck 80, the third arm 20c is withdrawn and the shutter 30 is moved up and then, the load/unload port 7a is closed. Subsequently, while the wafer W2 is rotated by the spin chuck 80 and ammonia/hydrogen peroxide solution mixture is supplied to the wafer W2 from the first nozzle 92, the wafer W2 is rubbed by the rotation brush 91 to wash the surface of the wafer W2 with an APM solution (Step S63). After completion of the APM washing, pure wafer serving as a rinse solution is supplied to the wafer W2 to rinse the wafer W2. Furthermore, the wafer W2 is rotated at a high speed by the spin chuck 80 to separate and remove the attached solution from the wafer W2 (Step S64). In this manner, the surface of the second wafer W2 is dried.

Then, as shown in FIG, 19B, the load/unload 7a of the second unit 7 is opened. Subsequently, the second arm 20b is inserted into the second unit 7 to unloaded the second wafer W2 from the second unit 7 by the second arm 20b (Step S65).

Furthermore, as shown in FIG. 19C, the load/unload port 8a of the third unit 8 is opened to load the second wafer W2 into the third unit 8 by the second arm 20b (Step S66). When the second wafer W2 is transferred onto the spin chuck 80, the second arm 20b is withdrawn and the shutter 30 is moved up to close the load/unload port 8a. While the wafer W2 is rotated by the spin chuck 80 and the hydrofluoric acid solution is supplied from the first nozzle 92 to the wafer W2, the wafer W2 is rubbed by the rotation brush 91 to wash the surface of the wafer W2 with the DHF solution (Step S67). After completion of the DHF washing, pure water serving as a rinse solution is supplied to the wafer W2 to rinse the wafer W2. Furthermore, the wafer W2 is rotated at a high speed by the spin chuck 80 to separate and remove the attached solution from the wafer W2 (Step S68). In this manner, the surface of the wafer W2 is dried.

As shown in FIG. 19D, the load/unload port 8a of the third unit 8 is opened. Subsequently, the first arm 20a is inserted into the third unit 8 to unload the second wafer W2 from the third unit 8 by the first arm 20a (Step S69). Furthermore, the substrate transport apparatus 4 is faced again to the loader/unloader section 2 from the washing unit 3. Then, the first arm 20a is moved forward to store the second wafer W2 into the cassette C (Step S70). While up-and-down movement of the arm portion 20 is repeated, the wafer W is transferred to the processing units 9, 10, 11 in the lower stage of the substrate transport apparatus 4 and the wafer W is transferred to the processing units 6, 7, 8 in the upper stage thereof.

After the washed first wafer W1 to 25th wafer W25 are continuously stored in the cassette C, the cassette C is unloaded from the system 1 through the loader/unloader portion 2 by the transport robot (not shown) and load into a next process (Step S71).

In the aforementioned embodiments, the number of processing units are two or three. However, the present invention is not limited to thereto. The present invention may be applied to the case where the wafer is treated in four, six or five or seven processing units.

According to the embodiments, the first, second, third arms 20a, 20b, 20c are used separately depending upon its function. Therefore, contaminants such as particles rarely attach to a cleaned wafer. As a result, the surface of the wafer W can be maintained clean.

The moving distance of the shutter is reduced when the load/unload port is opened and closed as compared to the conventional case. Therefore, the throughput can be improved. Since the moving distance of the arm portion is reduced when the arm for use in loading/unloading is exchanged (since the arm is moved by the distance corresponding to two stages of the arm), the throughput is improved.

Furthermore, since the opening areas of the load/unload ports 6a to 11a are reduced, mutual interference between the inner atmosphere of the processing units 6 to 11 and outer atmosphere can be reduced.

Furthermore, the arm portion 20 is quickly moved up by simultaneously moving up the second and third slide covers 22b, 22c. Even if the substrate transport apparatus is used for a long time, airtightness of the cover 22 does not deteriorate at all and substantially no particles are generated.

Moreover, by virtue of the structure, liquid does not enter the inside of the cover even if liquid leakage takes place, with the result that inner driving mechanisms are not broken down with rust. In addition, a plurality of driving mechanisms are operated by a common motor and a common pinion, so that the substrate transport apparatus is reduced in size.

Figure 20:
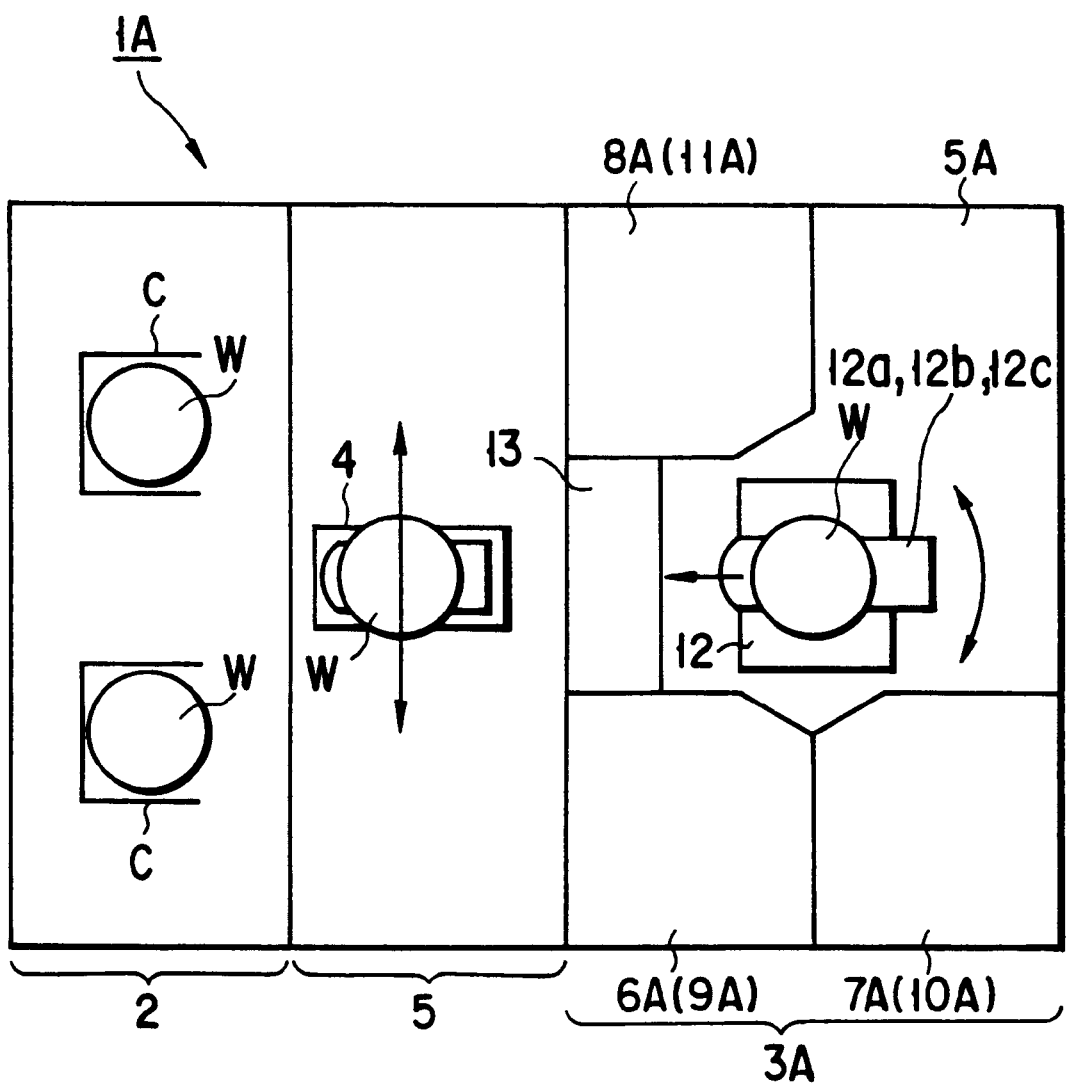
FIG. 20 is a plan view of a substrate processing system according to another embodiment of the present invention.

Now, the substrate processing system of another embodiment will be explained with reference to FIG. 20.

A substrate processing system 1A has a cassette section 2, first and second substrate transport arms mechanisms 4, 12, a processing section 3A and a buffer mechanism 13 serving as the substrate loading/unloading section. The cassette section 2 and the first substrate transporting arm mechanism 4 are the same as those in the aforementioned embodiment. The processing section 3A has a plurality of processing unit 6A–11A and the second substrate transporting arm mechanism 12, and the buffer mechanism 13. The processing units 6A–11A are substantially the same as the processing units 6–11 in the aforementioned embodiment. The substrate transporting arm mechanism 12 is arranged in a transport area 5A of the processing section 3A. The second substrate transporting arm mechanism 12 has three arms 12a, 12b, 12c each holding the wafer W, a back-and-forth moving mechanism for moving each of the arms 12a, 12b, 12c back and forth, a Z-axis driving mechanism for moving an arm portion up and down, and a θ rotation mechanism for rotating the arm portion around the Z-axis. Such a substrate transport apparatus 12 is disclosed in U.S. Pat. No. 5,664,254.

The processing unit 6A–11A and the buffer mechanism 13 are arranged so as to surround the second substrate transporting arm mechanism 12. The buffer mechanism 13 is interposed between the first transport area 5 and the second transport area 5A. The wafer W is transferred between the substrate transporting arm mechanism 4 and the second substrate transporting arm mechanism 12 via the buffer mechanism 13.

In the aforementioned embodiments, the buffer mechanism 13 is used as the substrate loading/unloading section. The present invention is not limited to this. The first and second substrate transfer arm mechanisms 4, 12 may be used in combination as the substrate loading/unloading section. More specifically, the wafer W may be directly transported between the first substrate transporting arm mechanism 4 and the second substrate transporting arm mechanism 12 without passing through the buffer mechanism 13. If so, the time required for transferring the wafer W can be reduced, increasing the throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate transport apparatus for transporting substrates from a substrate loading/unloading section to a processing section, which processes the substrates in accordance with a photolithography process, sequentially one by one, comprising:

a plurality of arms for holding a substrate;

a θ rotation driving mechanism for rotating the plurality of arms simultaneously around a vertical axis by an angle of θ;

an arm back-and-forth moving mechanism for moving each of the plurality of arms, back and forth;

a Z-axis driving mechanism for moving the plurality of arms, simultaneously up and down; and a cover assembly surrounding the Z-axis driving mechanism in order to shut out the Z-axis driving mechanism from an outer atmosphere, the cover assembly further comprising:

an unmovable slide cover which is not driven by the up-and-down movement of the Z-axis driving mechanism and thus maintained unmoved;

an unmovable support member connected to an upside of the unmovable slide cover;

a first movable slide cover provided in an outer periphery of the unmovable slide cover and slidably driven by the up-and-down movement of the Z-axis driving mechanism, relative to the unmovable slide cover;

a first movable support member connected to an inside of the first movable slide cover, and movable up and down along with the first movable slide cover;

a second movable slide cover provided in an outer periphery of the first movable slide cover and slidably driven by the up-and-down movement of the Z-axis driving mechanism, relative to the first movable slide cover;

a second movable support member connected to an inside of the second movable slide cover, and movable up and down along with the second movable slide cover;

a first slide seal attached to an outer periphery of the first movable support member thereby sealing a clearance between the first movable support member and the unmovable support member; and a second slide seal attached to an outer periphery of the second movable support member thereby sealing a clearance between the second movable support member and the first movable support member; and wherein, when the plurality of arms are moved up by the Z-axis driving mechanism, the first movable support member is moved up along with the first slide cover, with the clearance between the first movable support member and the unmovable support member sealed by the first slide seal, and the second movable support member is moved along with the second slide cover, with the clearance between the second movable support member and the first movable support member sealed by the second slide seal, whereby the first and second movable slide covers slidably move to the unmovable slide cover, with the result that the first and second movable slide covers are located above the unmovable slide cover.

2. The apparatus according to claim 1, wherein the Z-axis driving mechanism comprises:

a first ball screw mechanism for moving the first movable slide cover up and down to the unmovable slide cover; and a second ball screw mechanism for moving the second movable slide cover up and down to the first movable slide cover, in synchronism with the first movable slide cover.

3. The apparatus according to claim 2, wherein the first ball screw mechanism comprises:

a first ball screw having one end fixed to the unmovable support member;

a first nut engaged with the first ball screw for moving the first movable slide cover up and down;

a belt hanging around the first nut; and a common motor for transmitting rotatory driving force to the belt; and the second ball screw mechanism comprises:

a second ball screw rotatably attached to the first movable support member without moving up and down;

a second nut engaged with the second ball screw and fixed to the second movable support member; and a pulley having the belt hung thereon and fitted to a lower portion of the second ball screw.

4. The apparatus according to claim 1, wherein the Z-axis driving mechanism comprises:

a first rack/pinion mechanism for moving the first movable slide cover up and down to the unmovable slide cover; and a second rack/pinion mechanism for moving the second movable slide cover up and down to the first movable slide cover, in synchronism with the first movable slide cover.

5. The apparatus according to claim 4, wherein the first rack/pinion mechanism comprises:

a first rack having one end fixed on the unmovable slide cover, and another end reaching an inside of the first movable support member;

a common pinion engaged with the first rack; and a common motor for directly transmitting rotatory driving force to the common pinion, and the second rack/pinion mechanism comprises:

a second rack having one end fitted to the second movable support member and engaged with the common pinion, and another end reaching an inside of the unmovable support member.

6. The apparatus according to claim 3, further comprising an exhaust port opening at a bottom of the unmovable support member configured to exhaust an inner space of the cover assembly, the exhaust part communicating with a factory exhaust passage assembly.

* * * * *